US008918686B2

(12) United States Patent
Lai et al.

(10) Patent No.: US 8,918,686 B2
(45) Date of Patent: Dec. 23, 2014

(54) DETERMINING DATA VALID WINDOWS IN A SYSTEM AND METHOD FOR TESTING AN INTEGRATED CIRCUIT DEVICE

(75) Inventors: Bosco Chun Sang Lai, Markham (CA); Sunny Lai-Ming Chang, Markham (CA); Lawrence Wai Cheung Ho, Mississauga (CA)

(73) Assignee: KingTiger Technology (Canada) Inc., Markham, Ontario (CA)

( * ) Notice: Subject to any disclaimer, the term of this patent is extended or adjusted under 35 U.S.C. 154(b) by 474 days.

(21) Appl. No.: 12/859,099

(22) Filed: Aug. 18, 2010

(65) Prior Publication Data

US 2012/0047411 A1 Feb. 23, 2012

(51) Int. Cl.
*G11C 29/00* (2006.01)
*G01R 31/3193* (2006.01)
*G01R 31/319* (2006.01)

(52) U.S. Cl.
CPC ...... *G01R 31/31937* (2013.01); *G01R 31/3191* (2013.01)
USPC ...................................... 714/721

(58) Field of Classification Search
USPC ........................................... 702/79
See application file for complete search history.

(56) References Cited

U.S. PATENT DOCUMENTS

| | | | |
|---|---|---|---|
| 4,379,259 A | 4/1983 | Varadi et al. | |
| 4,412,327 A * | 10/1983 | Fox et al. | 714/721 |
| 4,484,329 A | 11/1984 | Slamka et al. | |
| 4,821,238 A | 4/1989 | Tatematsu | |
| 4,965,799 A | 10/1990 | Green et al. | |
| 5,794,175 A | 8/1998 | Conner | |
| 5,919,270 A | 7/1999 | Arkin | |
| 5,959,914 A | 9/1999 | Gates et al. | |
| 5,995,424 A | 11/1999 | Lawrence et al. | |
| 6,014,759 A | 1/2000 | Manning | |
| 6,055,653 A | 4/2000 | LeBlanc et al. | |
| 6,055,661 A | 4/2000 | Luk | |
| 6,058,055 A | 5/2000 | Brunelle | |

(Continued)

FOREIGN PATENT DOCUMENTS

WO 02/29824 4/2002

*Primary Examiner* — Michael Maskulinski
(74) *Attorney, Agent, or Firm* — Bereskin & Parr LLP/S.E.N.C.R.L., s.r.l.

(57) ABSTRACT

Embodiments of a system and method for testing an integrated circuit device are described herein. Testing is complemented by a determination of characteristics of a data valid window that identifies components of a response data signal from a device under test where the data signal can always be expected to be stable. In at least one embodiment, the method comprises: for each individual data bit region of one or more data bit regions of a second data signal, sampling the second data signal at a plurality of points of the individual data bit region to produce a plurality of sampled values for the second data signal; for each sampled value of the plurality of sampled values, determining whether the sampled value matches an expected bit pattern value corresponding to the sampled value; determining one or more characteristics of the data valid window that defines conditions under which a valid sample can be expected to be taken; and outputting a test outcome based on one or more characteristics of the data valid window. In some embodiments, the second data signal may be sampled at the plurality of points of the individual data bit region concurrently. In some embodiments, the determination of whether each sampled value of the plurality of sampled values matches the expected bit pattern value may be performed concurrently for all of the plurality of sampled values.

37 Claims, 11 Drawing Sheets

Ideal Data Bit Diagram

Real Data Bit Diagram

(56) References Cited

U.S. PATENT DOCUMENTS

| | | | |
|---|---|---|---|
| 6,134,690 A | 10/2000 | Ivaturi et al. | |
| 6,178,526 B1 | 1/2001 | Nguyen et al. | |
| 6,202,186 B1 | 3/2001 | Oonk | |
| 6,275,962 B1 | 8/2001 | Fuller et al. | |
| 6,345,372 B1 | 2/2002 | Dieckmann et al. | |
| 6,389,525 B1 | 5/2002 | Reichert et al. | |
| 6,425,095 B1 | 7/2002 | Yasui | |
| 6,452,411 B1 | 9/2002 | Miller et al. | |
| 6,546,511 B1 | 4/2003 | Sim et al. | |
| 6,574,759 B1 | 6/2003 | Woo et al. | |
| 6,615,379 B1 | 9/2003 | Tripp et al. | |
| 6,646,936 B2 | 11/2003 | Hamamatsu et al. | |
| 6,701,474 B2 | 3/2004 | Cooke et al. | |
| 6,708,298 B2 | 3/2004 | Corbin et al. | |
| 6,731,125 B2 | 5/2004 | Chang | |
| 6,754,117 B2 | 6/2004 | Jeddeloh | |
| 6,820,027 B2 * | 11/2004 | Weller | 702/117 |
| 6,851,076 B1 | 2/2005 | Cook, III et al. | |
| 6,880,118 B2 | 4/2005 | Chen et al. | |
| 6,888,366 B2 | 5/2005 | Kim et al. | |
| 7,010,452 B2 | 3/2006 | Gomes et al. | |
| 7,085,980 B2 | 8/2006 | Martin-de-Nicolas et al. | |
| 7,088,122 B2 | 8/2006 | Hartmann et al. | |
| 7,092,902 B2 | 8/2006 | Eldridge et al. | |
| 7,119,567 B2 | 10/2006 | Ma et al. | |
| 7,131,046 B2 | 10/2006 | Volkerink et al. | |
| 7,142,003 B2 | 11/2006 | Kanbayashi et al. | |
| 7,159,160 B2 | 1/2007 | Yoh et al. | |
| 7,216,273 B2 | 5/2007 | Phelps et al. | |
| 7,350,108 B1 | 3/2008 | Dean et al. | |
| 7,478,280 B2 | 1/2009 | Dean et al. | |
| 7,620,861 B2 | 11/2009 | Lai et al. | |
| 7,757,144 B2 | 7/2010 | Lai et al. | |
| 7,783,452 B2 * | 8/2010 | Baba et al. | 702/180 |
| 7,848,899 B2 | 12/2010 | Lai et al. | |
| 2004/0123207 A1 * | 6/2004 | Zumkehr et al. | 714/744 |
| 2009/0115443 A1 * | 5/2009 | Lai et al. | 324/765 |
| 2009/0216488 A1 * | 8/2009 | Baba et al. | 702/180 |
| 2009/0281747 A1 * | 11/2009 | Ishida et al. | 702/66 |
| 2010/0066443 A1 * | 3/2010 | Yamamoto et al. | 329/347 |
| 2010/0118627 A1 * | 5/2010 | Best | 365/193 |
| 2011/0115468 A1 * | 5/2011 | Kantake et al. | 324/76.77 |

* cited by examiner

Ideal Data Bit Diagram

Real Data Bit Diagram

Alignment of Data and Data Strobe Signals from Memory Device

Alignment of Data and Data Strobe Signals after Minimum Delay

Alignment of Data and Data Strobe Signals after Maximum Delay

*Data Signal Transformation*

*Input and Output Data Signals ($V_{Ref\_Hi}$)*

*Input and Output Data Signals ($V_{Ref\_Lo}$)*

DETERMINING DATA VALID WINDOWS IN A SYSTEM AND METHOD FOR TESTING AN INTEGRATED CIRCUIT DEVICE

TECHNICAL FIELD

The described embodiments relate to a system and method for testing integrated circuit devices, such as memory devices. More particularly, the described embodiments relate to the generation of output parameters that identify characteristics of a data valid window for an integrated circuit device under test.

BACKGROUND

Integrated circuit devices are typically subject to rigorous testing before they are sold or put to their intended use. In particular, each integrated circuit device is tested to determine whether or not certain specifications for that type of device, as determined and set by the manufacturer for example, are met.

An integrated circuit device may be tested by performing functional testing, application-specific testing, or both. Functional testing relates to whether or not the hardware found within the integrated circuit device is free from defects and meets manufacturer specifications. For example, if the integrated circuit device is or comprises a memory component such as a memory device, functional testing relates to whether or not a digital value (e.g. "1" or "0") written to a cell of memory will later be retrieved without error, regardless of how the memory device is implemented.

Functional testing also relates to whether or not certain critical operating characteristics of the integrated circuit device fall within an allowable range of values. These critical operating characteristics may include such characteristics as power consumption, standby current, leakage current, voltage levels, and access time. The allowable range may equally be set by the manufacturer of the device or by appropriate standards.

Functional testing is generally oriented toward discovering whether or not an integrated circuit device under test is likely to fail during its intended use or application. It involves testing integrated circuit devices to verify how they execute a set of functions during testing procedures that are specifically designed for the particular use or application.

During application-specific testing, integrated circuit devices may be subject to a testing of their system behavior in order to detect their behavioral failures. A behavioral failure is a type of failure that occurs when an integrated circuit device is operated within an actual application system. For example, it may be a failure that occurs as a result of a specific command or access sequence to a memory device found in normal PC operations.

It is not necessarily the case that functional testing will detect behavioral failures because, during functional testing, the operation of the integrated circuit device under test is not necessarily indicative of how the device will behave during its intended application. Accordingly, complete and comprehensive testing of an integrated circuit device may require application-specific testing in addition to functional testing.

The testing of integrated circuit devices may involve the use of test vector patterns. In particular, test vector patterns may be generated by an appropriate test vector generator, and then transmitted by a tester to a device under test across a communication channel. The device under test then sends a response signal to the tester. The bit pattern contained in the response signal may be compared to a copy of the transmitted test vector pattern that is stored by the tester to determine if the device under test has produced an expected result.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

DETAILED DESCRIPTION

Data Bit Regions and Data Valid Windows

As noted above, the testing of integrated circuit devices may involve the use of test vector patterns. A test vector pattern may be generated by an appropriate test vector generator, and then transmitted by a tester to a device under test across a communication channel. The device under test then sends a response signal to the tester. This response signal is also referred to herein as a response data signal. The bit pattern contained in the response data signal (also referred to herein as the "response bit pattern") may be compared to a copy of the transmitted test vector pattern that is stored by the tester, to determine if the device under test has produced an expected result.

When the response data signal arrives at the tester, samples of the response data signal are taken in order to determine the values of the bit pattern that was generated by the device under test. A sampling clock signal, generated at the tester in some instances, may be employed to facilitate this sampling, which is performed at the tester. Besides employing the sampling clock signal generated at the tester, sampling may be performed using a data strobe signal.

Even in situations where the response data signal generated by the device under test is aligned with the sampling clock signal of the tester or with the data strobe signal, by the time the response data signal reaches the tester, slight phase differences may be introduced between the response data signal and data strobe signal. Phase differences may also be introduced between different response data signals received from multiple devices under test as well. The magnitude of the phase differences may be dependent on the distance that the response data signal must travel between the device under test and the tester, for example. Accordingly, in order that samples of the response data signal can be more accurately taken by the tester despite these slight phase differences, a "good" memory device is expected to generate a response data signal that, for each individual bit ("1" or "0") to be read from the response data signal, provides a stable value for that individual bit for a certain period of time during which a sample might be taken, and that period of time should conform to defined standards.

In this regard, a "data valid window" may be identified for a given integrated circuit device, for use in determining whether the integrated circuit device meets specification requirements for that type of integrated circuit device. The data valid window may define, for example, a period of time in which a valid sample can be expected to be taken from within a given data bit region of a given data signal, such as the response data signal received by a tester from the integrated circuit device. Each part of a given data signal in which the value of a single bit (i.e. "1" or "0") is asserted so that the bit may be read from the given data signal constitutes a data bit region.

Figure 1:
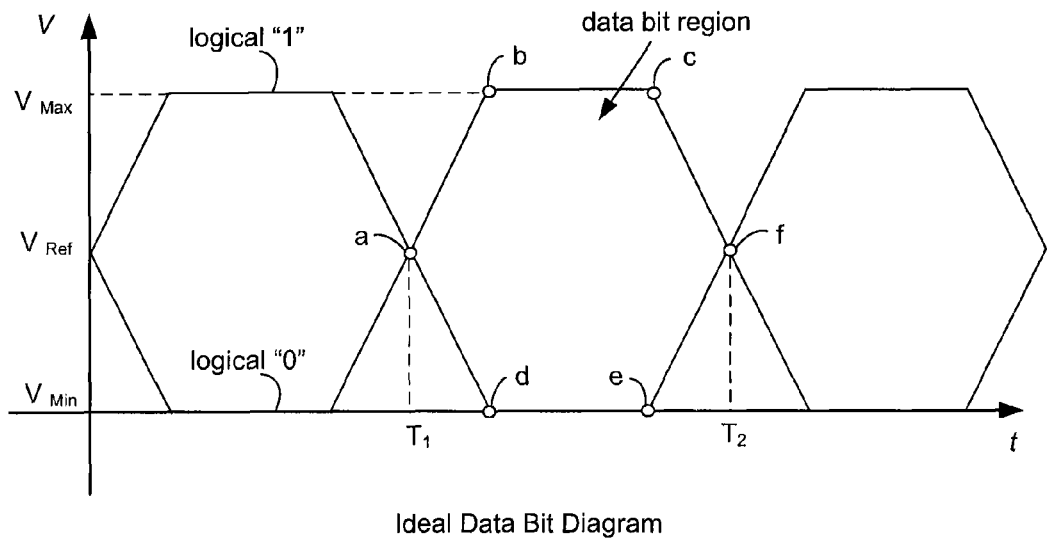
FIG. 1 illustrates examples of data bit diagrams, wherein a data bit region and a corresponding data valid window is identified.
Figure 1:
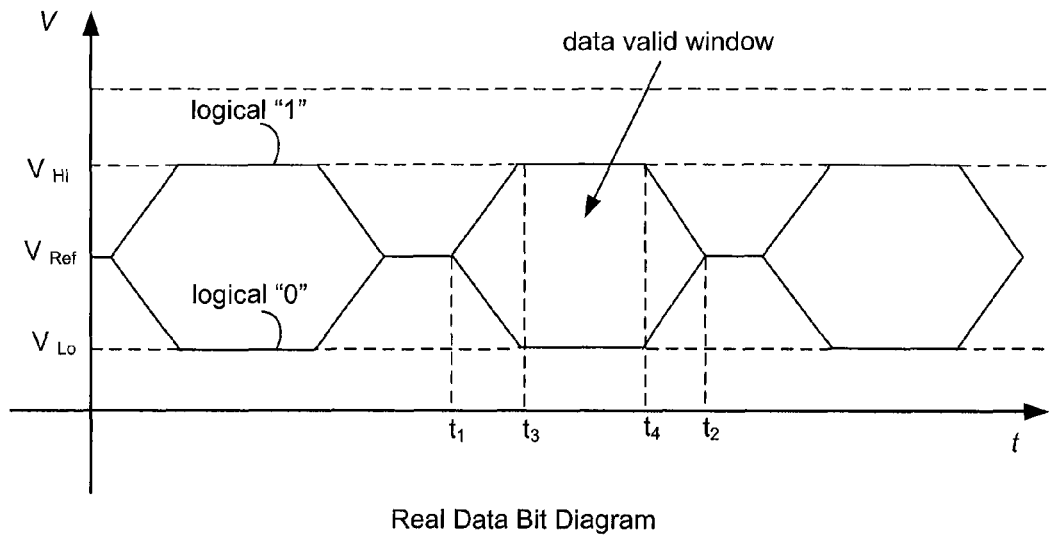

For instance, consider the example data bit diagrams shown in FIG. 1. In the "Ideal Data Bit Diagram", a series of data bit regions is illustrated. Consider the example data bit region bound by points 'a' through 'f'. When a device is to output a logical "1" value, after a certain time following $T_1$ where the signal may still be undergoing a transition to the "1" value, the voltage of the data signal ideally reaches a maximum voltage value $V_{Max}$ (e.g. 1.5 V) and remains stable at that value, between points 'b' and 'c'. Conversely, when a device is to output a logical "0" value, after a certain time following $T_1$ where the signal may still be undergoing a transition to the "0" value, the voltage of the data signal ideally reaches a minimum voltage value $V_{Min}$ (e.g. 0 V) and remains stable at that value, between points 'd' and 'e'. Typically, the values for $V_{Min}$ and $V_{Max}$ will define a range with some reference voltage $V_{Ref}$ (e.g. 750 mV) at its midpoint.

The interval $[T_1, T_2]$ as shown in FIG. 1 may also be referred to as a "data bit duration", representing the component of an individual data bit region in the time dimension. The interval $[V_{Min}, V_{Max}]$ as shown in FIG. 1 may also be referred to as a "data bit amplitude", representing the component of an individual data bit region in the voltage dimension.

A test engineer seeking to determine characteristics of the data valid window may send a test pattern to the device under test (e.g. a memory device), so that "1"s and "0"s are written to memory in alternating fashion and then read back from the response data signal. In this case, the signal transition from a "1" to a "0" or from a "0" to a "1" being read (or sampled) from the response data signal may produce natural boundaries for a given data bit region.

By the time the response data signal reaches the tester, a number of factors (e.g. jitter in the time dimension and signal attenuation in the voltage dimension) may degrade the signal, and one may no longer expect that a particular output level corresponding to an individual bit ("1" or "0") will have remained stable for the entire ideal length of time and at the corresponding ideal voltage, such that a valid sample can be expected to be taken at all points within the data bit region as shown in the Ideal Data Bit Diagram.

Accordingly, the "Read Data Bit Diagram" shown in FIG. 1 illustrates that, in practice, there is a shorter period of time within the ideal size of a data bit region in the time dimension (i.e. of the data bit duration) in which a valid sample can be expected to be taken. This may imply that the effective length of the data bit region in the time dimension will shrink (e.g. see interval $[t_1, t_2]$). Furthermore, in practice, the range between the voltage level corresponding to a logical "1" and the voltage level corresponding to a logical "0" of the actual received data signal may also be narrower, as compared to the ideal size of the data bit region in the voltage dimension (i.e. of the data bit amplitude). These properties of the data signal as it is actually received (e.g. by a tester) may be taken into account when determining a data valid window.

The data valid window for a device under test is determined to identify components of a response data signal (e.g. in the time dimension and/or the voltage dimension) received from the device under test, in respect of an individual data bit region, where the data signal can always be expected to be stable and to not be undergoing a transition from "1" to "0" or vice-versa. Any sample taken outside of the data valid window would not be guaranteed to contain valid data. The data valid window may account not only for delays associated with data propagation, but also for delay associated with memory access, clock skew, and variations due to temperature and voltage, for example.

In the example of FIG. 1, the period of time in which the response data signal can be expected to be stable is shown by the interval $[t_3, t_4]$, and the range of voltage values in which the response data signal can be expected to be stable is shown by the interval $[V_{Lo}, V_{Hi}]$. The length of these intervals, and the specific values defining the boundaries of these intervals are examples of characteristics of a data valid window for a device under test, which a test engineer may wish to determine and compare to specification requirements.

An Example of a Known Method of Determining a Data Valid Window Using a Phase-Adjusted Second Clock Signal In accordance with one known method, determining the "boundaries" or characteristics of a data valid window associated with an integrated circuit device may involve a tester repeating the transmission of a particular test vector pattern to a device under test. An instance of a response data signal is then received from the device under test in response to each repeat transmission of the same test vector pattern. Since all of the response data signals are to be synchronized with the same clock signal (e.g. a first clock signal having a fixed phase that is generated by the tester), each response data signal, received at the tester from the device under test in response to the repeated transmissions of the same test vector pattern, should be substantially identical.

However, in the known method identified above, in order to determine the characteristics of the data valid window, the phase of a second clock signal (which is different from the first clock signal) generated at the tester is incrementally adjusted before each response data signal is received, so that the expected response of the device under test at different points in time within a given data bit region of the response data signal can be identified by analyzing the multiple instances of the response data signal received. Accordingly, a sample within one data bit region of a first response data signal received in response to a first transmission of the particular test vector pattern can be taken at one point in time relative to the first clock signal, a sample within the corresponding data bit region of a second response data signal received in response to a second transmission of the same test vector pattern can be taken at a different point in time relative to the same first clock signal, a sample within the corresponding data bit region of a third response data signal received in response to a third transmission of the same test vector pattern can be taken at yet another different point in time relative to the same first clock signal, and so on.

As the second clock signal is changed in phase, the testing process will reveal that the samples obtained from a particular data signal are valid only at certain phases (i.e., a stable value is obtained from the data signal and it matches the expected value), while the samples obtained from the data signal at other phases will not be valid (i.e., the signal value obtained at the given phase step does not always match the expected value).

In the known method, through a combination of repeating the transmission of a test vector pattern to the device under test, adjusting the phase of the second clock signal of the tester over a range of multiple pre-defined phase steps that would cover an individual data bit region, and analyzing the samples of the different response data signals received at the tester in response to the repeated transmissions of the same test vector pattern to the device under test and sampled using the phase-adjusted second clock signal, it is possible to determine at what points in time the device under test is, or is not expected to produce stable values.

In particular, where a memory device being tested is "good", it is expected that a valid sample of the particular response data signal received from the memory device may be taken over a finite number of consecutive phase steps of the second sampling clock, provided that the phase steps are sufficiently small. Using this information, a test engineer or test program, for example, will be able to identify a corresponding period of time in which a valid sample can be expected to be taken from a given data bit region of the particular data signal originating from the memory device. As noted above, this period of time may be defined for that particular memory device conceptually as a "data valid window" associated with that memory device. The characteristics of the data valid window (e.g. the length of the period of time in which a valid sample can be expected to be taken from a given data bit region, and when the data valid window starts and when it ends) can then be compared with specification requirements, for example.

Comparison to the Example of the Known Method

As with the known method described above, at least some embodiments described herein are generally also directed to a method of identifying the characteristics of a data valid window for a device under test such as a memory device.

However, unlike the known method described above, embodiments described herein do not require repeated transmissions of the same test vector pattern to the device under test, nor the sampling of multiple response data signals received from the device under test in response to repeated transmissions of the same test vector pattern.

In at least one example embodiment described herein, additional testing components are utilized to allow multiple samples to be taken of an individual data bit region of a single instance of a response data signal received at the tester in response to one given transmission of a test vector pattern to the device under test, to determine a data valid window for the device under test. The multiple samples may be taken concurrently. The use of additional testing components may increase testing hardware requirements, but the testing process may be shortened relative to a system where analysis of multiple response data signals received in response to repeated transmissions of the same test vector pattern may be required.

At least some embodiments described herein also permit a data valid window having multiple dimensions to be determined.

Embodiments disclosed herein relate generally to a system and method for testing an integrated circuit device, such as a memory device.

In one broad aspect, there is provided a method of testing an integrated circuit device, the method comprising: generating a plurality of test vector patterns; for each test vector pattern of the plurality of test vector patterns: transmitting a first data signal comprising the test vector pattern to the integrated circuit device; receiving a second data signal from the integrated circuit device in response to the transmitting; for each individual data bit region of one or more data bit regions of the second data signal, sampling the individual data bit region at a plurality of points to produce a plurality of sampled values for the second data signal; and for each sampled value of the plurality of sampled values, determining whether the sampled value matches an expected bit pattern value corresponding to the sampled value; if, for every one of the plurality of sampled values, and for every one of the plurality of test vector patterns, each sampled value is determined to match the expected bit pattern value corresponding to the sampled value, then determining one or more characteristics of a data valid window that defines conditions under which a valid sample can be expected to be taken from a given data bit region of data signals transmitted by the integrated circuit device; and outputting a test outcome based on the one or more characteristics of the data valid window.

In another broad aspect, the second data signal may be sampled at the plurality of points of the individual data bit region concurrently.

In another broad aspect, the determination of whether each sampled value of the plurality of sampled values matches the expected bit pattern value may be performed concurrently for all of the plurality of sampled values.

In another broad aspect, the method further comprises: comparing the one or more characteristics of the data valid window with specification requirements for the integrated circuit device; wherein the test outcome indicates whether the one or more characteristics of the data valid window meet the specification requirements.

In another broad aspect, sampling the individual data bit region of the second data signal at the plurality of points comprises sampling the individual data bit region of the second data signal at a plurality of points in time, and wherein the data valid window defines a period of time in which the valid sample can be expected to be taken from a given data bit region of data signals transmitted by the integrated circuit device.

In another broad aspect, the method further comprises: identifying specification requirements for the integrated circuit device; and defining the plurality of points in time after identifying the specification requirements, but prior to the sampling.

In another broad aspect, sampling the individual data bit region of the second data signal at the plurality of points comprises sampling the individual data bit region of the second data signal at a plurality of voltage levels, and wherein the data valid window defines a voltage range in which the valid sample can be expected to be taken from a given data bit region of data signals transmitted by the integrated circuit device.

In another broad aspect, the method further comprises: identifying specification requirements for the integrated circuit device; and defining the plurality of voltage levels after identifying the specification requirements, but prior to the sampling.

In another broad aspect, sampling the individual data bit region of the second data signal at the plurality of points comprises sampling the individual data bit region of the second data signal at a plurality of points in time at each one of a plurality of voltage levels, and wherein the data valid window defines a period of time, for each voltage level within a voltage range of a given data bit region of data signals transmitted by the integrated circuit device, in which the valid sample can be expected to be taken from the given data bit region.

In another broad aspect, the method further comprises: identifying specification requirements for the integrated circuit device; and defining the plurality of points in time and the plurality of voltage levels after identifying the specification requirements, but prior to the sampling.

In another broad aspect, sampling the individual data bit region of the second data signal at the plurality of points comprises: for each variable test parameter of a plurality of variable test parameters, sampling the individual data bit region of the second data signal at different values for the variable test parameter, wherein the data valid window defines a range of values for the variable test parameter in which the valid sample can be expected to be taken from a given data bit region of data signals transmitted by the integrated circuit device.

In another broad aspect, the method further comprises: identifying specification requirements for the integrated circuit device; and for each variable test parameter of the plurality of variable test parameters, defining the different values for the variable test parameter after identifying the specification requirements, but prior to the sampling.

In another broad aspect, the plurality of variable test parameters comprises at least three different variable test parameters.

In another broad aspect, the test vector pattern is written to the integrated circuit device, and the second data signal comprises a bit pattern read from the integrated circuit device in response to the transmitting.

In another broad aspect, the integrated circuit device utilizes a data strobe signal that accompanies data signals transmitted by the integrated circuit device.

In another broad aspect, the data strobe signal is employed when sampling the second data signal.

In another broad aspect, the method further comprises generating a sampling clock signal, and the sampling clock signal is employed when sampling the second data signal.

In another broad aspect, the integrated circuit device comprises at least one memory device.

In another broad aspect, there is provided a testing system for testing an integrated circuit device, the system comprising: a processor; a program memory; and a controller; wherein the system is configured to: generate a plurality of test vector patterns; for each test vector pattern of the plurality of test vector patterns: transmit a first data signal comprising the test vector pattern to the integrated circuit device; receive a second data signal from the integrated circuit device in response to a transmission of the first data signal; for each individual data bit region of one or more data bit regions of the second data signal, sample the individual data bit region at a plurality of points to produce a plurality of sampled values; and for each sampled value of the plurality of sampled values, determine whether the sampled value matches an expected bit pattern value corresponding to the sampled value; if, for every one of the plurality of sampled values, and for every one of the plurality of test vector patterns, each sampled value is determined to match the expected bit pattern value corresponding to the sampled value, then determine one or more characteristics of a data valid window that defines conditions under which a valid sample can be expected to be taken from a given data bit region of data signals transmitted by the integrated circuit device; and output a test outcome based on one or more characteristics of the identified data valid window.

In another broad aspect, the system is configured to sample the second data signal at the plurality of points of the individual data bit region concurrently.

In another broad aspect, the system is configured to determine whether each sampled value of the plurality of sampled values matches the expected bit pattern value concurrently for all of the plurality of sampled values.

In another broad aspect, the system is further configured to: compare the one or more characteristics of the data valid window identified in the output parameters with specification requirements for the integrated circuit device; wherein the test outcome indicates whether the one or more characteristics of the data valid window meet the specification requirements.

In another broad aspect, the controller comprises a plurality of delay elements configured to receive the second data signal such that the individual data bit region of the second data signal is sampled at a plurality of points in time, and the data valid window defines a period of time in which the valid sample can be expected to be taken from a given data bit region of data signals transmitted by the integrated circuit device.

In another broad aspect, the controller comprises a plurality of voltage comparators configured to receive the second data signal such that the individual data bit region of the second data signal is sampled at a plurality of voltage levels, and the data valid window defines a voltage range in which the valid sample can be expected to be taken from a given data bit region of data signals transmitted by the integrated circuit device.

In another broad aspect, the controller comprises both a plurality of delay elements and a plurality of voltage comparators configured to receive the second data signal such that the individual data bit region of the second data signal is sampled at a plurality of points in time at each one of a plurality of voltage levels, and the data valid window defines a period of time, for each voltage level within a voltage range of a given data bit region of data signals transmitted by the integrated circuit device, in which the valid sample can be expected to be taken from the given data bit region.

In another broad aspect, for each variable test parameter of a plurality of variable test parameters: the controller comprises a plurality of circuit elements configured to receive the second data signal such that the individual data bit region of the second data signal is sampled at different values for the variable test parameter, and the data valid window defines a range of values for the variable test parameter in which the valid sample can be expected to be taken from a given data bit region of data signals transmitted by the integrated circuit device.

In another broad aspect, the plurality of variable test parameters comprises at least three different variable test parameters.

In another broad aspect, the integrated circuit device utilizes a data strobe signal that accompanies data signals transmitted by the integrated circuit device, and the controller is configured to employ the data strobe signal to sample the second data signal.

In another broad aspect, the controller comprises a switch, wherein when the switch is in a first position, the controller employs the data strobe signal to sample the second data signal, and wherein when the switch is in a second position, the controller employs a sampling clock signal provided by the system to sample the second data signal.

In another broad aspect, the integrated circuit device comprises at least one memory device, and the system comprises at least one reference memory device from which the expected bit pattern is obtained.

In another broad aspect, the system further comprises: a test vector pattern generator for generating the plurality of test vector patterns, and at least one comparator for determining whether the sampled value matches an expected bit pattern value corresponding to the sampled value Features of these and other aspects, and of a number of example embodiments are described in further detail below.

Further Details of Example Embodiments

Figure 2:
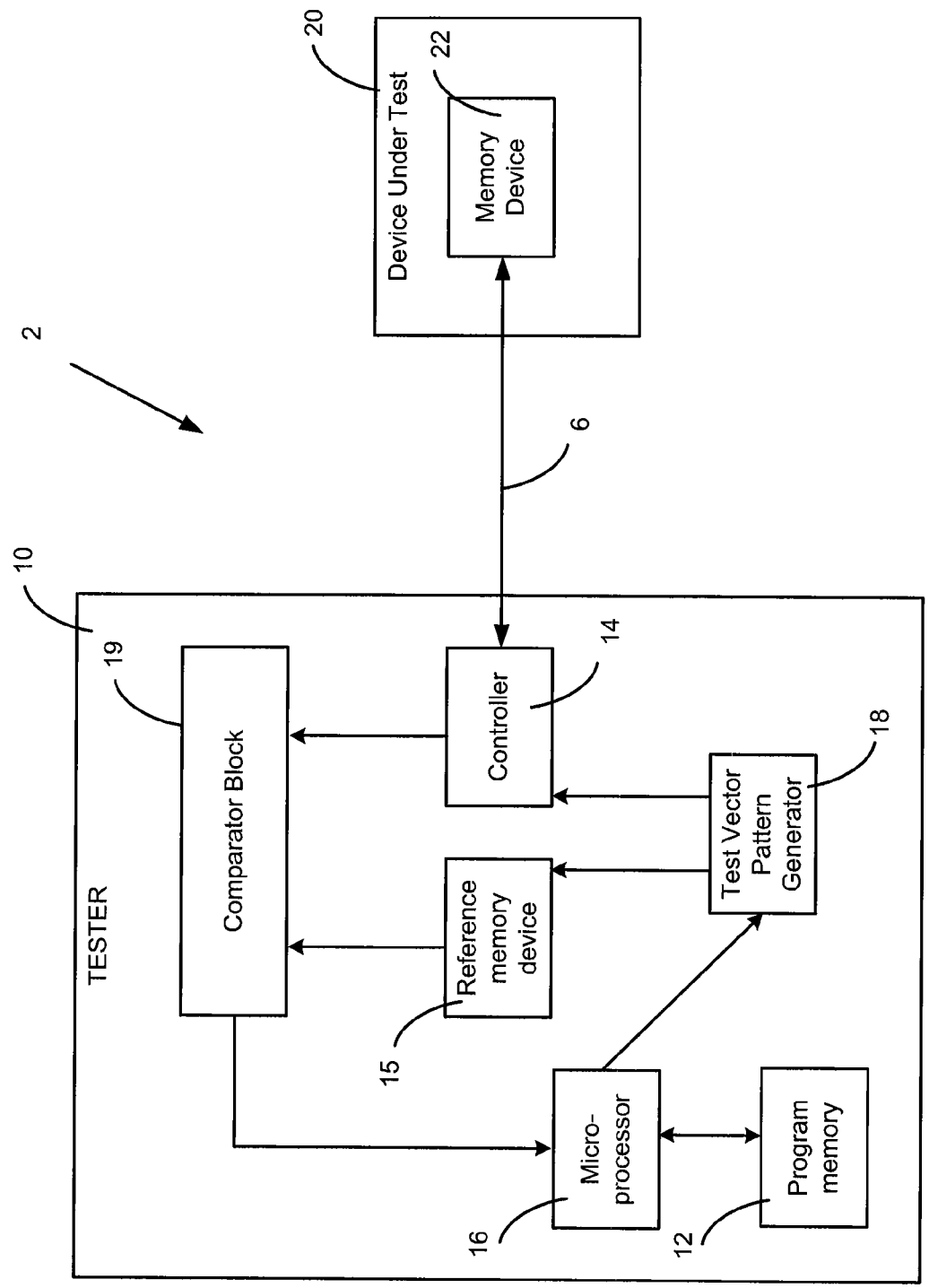
FIG. 2 is a block diagram of a testing system comprising a memory device under test and a tester module, in accordance with at least one embodiment.

Referring to FIG. 2, a test system 2 comprising a tester 10 for testing an integrated circuit device is illustrated. The integrated circuit device being tested 20 is also referred to herein generally as a device under test (DUT). For brevity, and by way of example, the integrated circuit device being tested 20 will be described herein as comprising a single memory device 22. However, it will be understood that in some embodiments, DUT 20 may comprise a plurality of memory devices (e.g. in one or more memory modules). Additional components [not shown] may be added and/or modifications to the illustrated components may be made to facilitate testing of each of the plurality of memory devices consecutively. Alternatively, the testing of the plurality of memory devices may be performed in parallel. For example, multiple instances of controller 14 may be implemented to facilitate testing of the plurality of memory devices in parallel. Moreover, in variant embodiments, DUT 20 may comprise one or more devices other than memory devices.

Tester 10 transmits signals to and receives signals from the device under test (DUT) 20 via a communication channel 6.

Some of the components of tester 10 are illustrated by way of example in FIG. 2, and as described below. It will be understood by persons skilled in the art that in variant embodiments, tester 10 may comprise different components than those shown in the Figures. Furthermore, it will be understood that tester 10 may comprise components that are not explicitly described with reference to the Figures for ease of exposition.

In one embodiment, tester 10 comprises program memory 12, a controller 14, a microprocessor 16, a test vector pattern generator (TVPG) 18, and a comparator block 19 that comprises at least one comparator. Where DUT 20 comprises at least one memory device 22, the tester 10 may also comprise a reference memory device 15. Some electrical connections between the various components of tester 10 are illustrated, by way of example, in FIG. 2. Some operations of tester 10 are described in the paragraphs below.

In performing the testing of DUT 20, microprocessor 16 retrieves an instruction or instructions from program memory 12. In response to that instruction, microprocessor 16 instructs TVPG 18 to generate a digital representation of a test vector pattern, which TVPG 18 then sends to controller 14. Controller 14 communicates with DUT 20 via a communication channel 6. After receiving the test vector pattern generated by TVPG 18, controller 14 converts the test vector pattern into an electrical waveform, which controller 14 then outputs to DUT 20 via communication channel 6. TVPG 18 also sends a digital representation of the test vector pattern to reference memory device 15 for temporary storage and use at a later stage in the testing. In variant embodiments, a reference memory module comprising multiple memory devices may be employed instead of a reference memory device 15, particularly where DUT 20 comprises multiple memory devices for example.

The test vector pattern output by controller 14 is transmitted electrically across communication channel 6 to DUT 20, where it is sampled back into digital form. At some point after the test vector pattern has been transmitted to DUT 20, DUT 20 electrically transmits across the communication channel a response data signal containing a response bit pattern for each memory device of DUT 20, namely memory device 22 in this example. Controller 14 of tester 10 then converts the response data signals received via communication channel 6 into digital form, the response data signals including the response data signal generated by memory device 22 that are dependent on the test vector pattern that was previously transmitted to it by tester 10.

Tester 10 and DUT 20 both operate on digital representations of test vector patterns. However, what are transmitted across communication channel 6 are electrical waveforms that are representative of test vector patterns. Conversion between the electrical and digital forms of a test vector pattern generally occurs at the input and/or output ports of both tester 10 and DUT 20. In the case of tester 10, in this example embodiment, it is controller 14 that performs the conversion. In the case of DUT 20, an appropriate component or module thereon [not shown] may be configured to perform the conversion.

After controller 14 receives a response data signal from memory device 22 of DUT 20 via communication channel 6, and converts the response data signal to digital form, it relays the converted response data signal from memory device 22 to comparator block 19. At the comparator block 19, the response data signal from memory device 22 is compared with a digital form of a reference signal (i.e. a reference bit pattern, also generally referred to as an expected bit pattern), namely the signal that controller 14 expects to receive from the memory device 22 that sent the response data signal. In one embodiment, the previously stored reference signal is transmitted to comparator block 19 by reference memory device 15. Comparator block 19 digitally determines whether or not the response data signal identically matches the corresponding reference signal, and outputs that logical determination to microprocessor 16.

If comparator block 19 determines an identical match between the two compared signals (i.e. the response data signal and the corresponding reference signal), then the corresponding memory device 22 being tested has, at least in the context of that particular test vector pattern, produced valid data. But where the two signals compared are not identical, then memory device 22 may have undergone failure of some kind. Where memory device 22 is not determined to have undergone any failures during testing, and memory device 22 is determined to meet any requisite specifications, then DUT 20 may be considered to be a "good" memory device.

Where DUT 20 comprises memory device 22, the reference signal will typically be the digital representation of the test vector pattern as generated by TVPG 18, since the process of writing to and reading from a memory cell does not, in general, involve digital logic. Therefore, there is no expectation of data transformation as part of the testing process. The digital test vector pattern sent to comparator block 19 from reference memory device 15 is delayed until controller 14 samples the returning waveforms, the purpose of the delay being to align timing. Reference memory device 15 transmits a reference signal to comparator block 19 for comparison with a response data signal received from memory device 22 of DUT 20, the response data signal being transmitted to comparator block 19 by the controller 14.

As noted above, the test vector patterns and the response data signals transmitted electrically across communication channel 6 have to be converted back into digital signals at DUT 20 or tester 10 respectively. When DUT 20 receives a test signal from tester 10, then DUT 20 performs the conversion by sampling the received signal. Similarly, when tester 10 receives a response data signal from DUT 20, then controller 14 of tester 10 may perform the conversion by sampling the received data signal.

Consider a response data signal received, by tester 10, from a given memory device 22 of DUT 20. In order for tester 10 to determine if the response from memory device 22 is as expected, tester 10 will need to sample the response data signal. A sampling clock signal generated at the tester may be employed in the sampling of response data signals.

In some testers, data may be sent to a memory device and captured from the memory device in accordance with a timing that is synchronized with the sampling clock signal. For example, in one example test methodology, a set of pre-determined test vector patterns that is to be used to test memory device 22 is initially determined, prior to testing. During the test, a test vector pattern is generated from the set of pre-determined test vector patterns, as noted above. A data signal comprising a test vector waveform corresponding to the generated test vector pattern is transmitted to memory device 22, along with an accompanying first clock signal generated by tester 10 that is synchronized with the test vector waveform. The first clock signal is synchronized with the test vector waveform in accordance with the specification of the device under test, so that the device under test can use the first clock signal to properly read from the test vector waveform. In particular, after data is written to memory device 22, data may be read from memory device 22 by tester 10. The data read from memory device 22 is received by tester 10, and once the data is converted from an electrical signal to digital form, the data can then be compared with a previously stored reference (e.g. expected) bit pattern.

A sample of a response data signal may be taken at different points in time within an individual data bit region. The ability to sample a data bit region of a response data signal at different points in time permits tester 10 to be used in a testing process where a data valid window for memory device 22 is identified. Tester 10 may be configured to determine at which points in time, within the individual data bit region, the response data signal is maintaining a particular expected bit value. Memory device manufacturers may use the data valid window identified for a memory device as an analytical tool.

In the known method referred to earlier in this description, sampling (within a data bit region) of multiple instances of the response data signal was required. However, the known method may be time-consuming. Furthermore, only temporal characteristics of the data valid window were identified.

Generally, a data valid window may define conditions in which a valid sample can be expected to be taken from within a given data bit region of a given data signal transmitted by an integrated circuit device, such as a memory device. These conditions may be represented by a range of values for any particular variable test parameters of interest.

A data bit region and a corresponding data valid window need not be restricted to two-dimensions. For example, in some embodiments, only one dimension associated with a single variable test parameter may be of interest (e.g. time or voltage only). In the one-dimensional case, a data bit region may be referred to instead more specifically as a data bit duration (e.g. where the dimension is time), as a data bit amplitude (e.g. where the dimension is voltage), or more generally as a data bit size. Accordingly, in the case where the single variable test parameter of interest is time, the data valid window would define a period of time in which a valid sample can be expected to be taken from within a given data bit duration of a given data signal. In the case where the single variable test parameter of interest is voltage, the data valid window would define a range of voltages in which a valid sample can be expected to be taken from within a given data bit amplitude of a given data signal.

If the data valid window defines a range of values for a single variable test parameter of interest, then it may be considered "one-dimensional". Alternatively, a combination of two variable test parameters may be considered, and a "two-dimensional" data valid window may be identified accordingly. More generally, a combination of two or more variable test parameters may be considered, and a "multi-dimensional" data valid window may be identified accordingly.

Therefore, the conditions in which a valid sample can be expected to be taken from within a given data bit region of a given data signal transmitted by an integrated circuit device may be represented by multiple ranges of values, with each range being associated with a different variable test parameter. Generally, a data valid window may define a range of values for any combination of one or more variable test parameters, such as time, voltage, memory operating frequency, and/or temperature, for example. Other parameters may also be considered.

By way of example only, and for ease of exposition, further details of embodiments described herein will be provided below primarily with reference to a two-dimensional data valid window.

Figure 3:
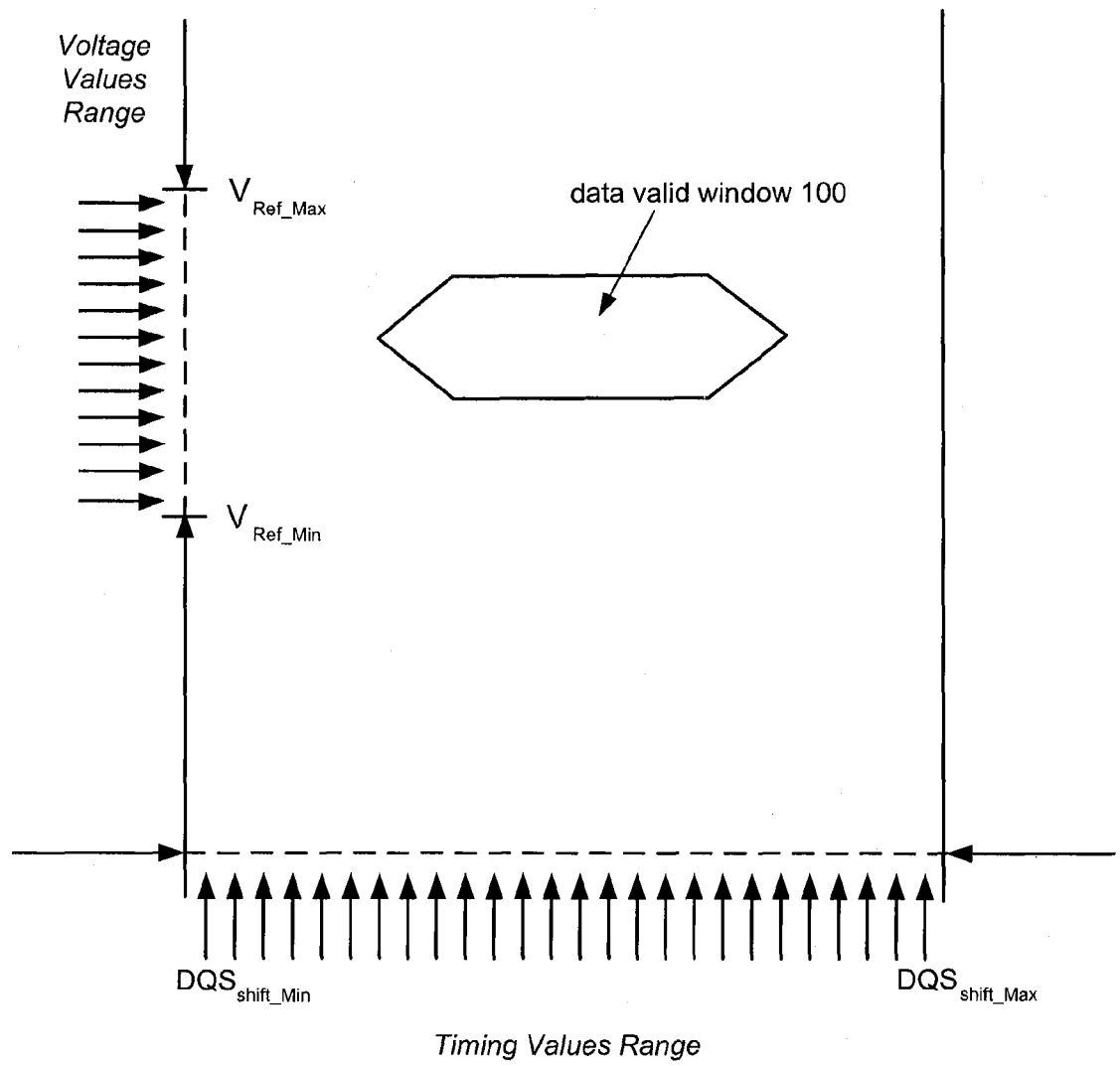
FIG. 3 is a schematic diagram that illustrates a data valid window determined for a device under test, in accordance with an example embodiment.

FIG. 3 illustrates an example of a two-dimensional data valid window determined for a device under test, such as memory device 22 of FIG. 2. Data valid window 100 defines a period of time, for each voltage level within a range of voltage values of a given data bit region of a given data signal (e.g. a response data signal from memory device 22 received at a tester), in which a valid sample can be expected to be taken from the given data bit region of the given data signal. A sample taken under conditions represented by a point outside of a data valid window 100 may not contain valid data. Different memory devices may have different associated data valid windows. A data valid window identified for a memory device is expected to meet specification requirements for that type of memory device. In general, multi-dimensional data valid windows may be used as analytical tools by memory device manufacturers, to analyze memory performance for example.

By sampling a given response data signal at multiple increments of voltage values over a range (e.g. from $V_{Ref\_Min}$ to $V_{Ref\_Max}$) and at multiple timing values over a range (e.g. phase adjustments from $DQS_{shift\_Min}$ to $DQS_{shift\_Max}$), and determining all points that represent a sample in which an expected value was obtained, a data valid window 100 may be identified from the determined points. By way of example, phase adjustments from 0 to 360 degrees or from 0 to 180 degrees may be made, depending on the type of device under test. The data valid window may be determined to have a size in the time dimension, of typically, for example, ½ to ⅔ of the data bit duration of the data bit region. Similarly the data valid window may be determined to have a size in the voltage dimension, of typically, for example, ⅓ to ⅔ of the data bit amplitude of the data bit region.

In identifying a data valid window 100, it is desirable to select boundaries that suggest that all points within those boundaries represent samples in which an expected value can be obtained (notwithstanding that there may be other points outside of the boundaries that represent samples in which an expected value could be obtained). For example, the length of a one-dimensional data valid window 100 is expected to be contiguous, and the area of a two-dimensional data valid window 100 (or other multi-dimensional data valid window) is expected to have an area having no "holes".

For analytical purposes, a data valid window of a certain number of dimensions may be used to identify another data valid window of fewer dimensions. For example, a two-dimensional data valid window that has been already been identified may be "sliced" to obtain a one-dimensional data valid window, and the characteristics of the resultant one-dimensional data valid window may be analyzed, for example. By extension, a three-dimensional data valid "window" may be "sliced" to obtain a two-dimensional data valid window, and so on.

Figure 4:
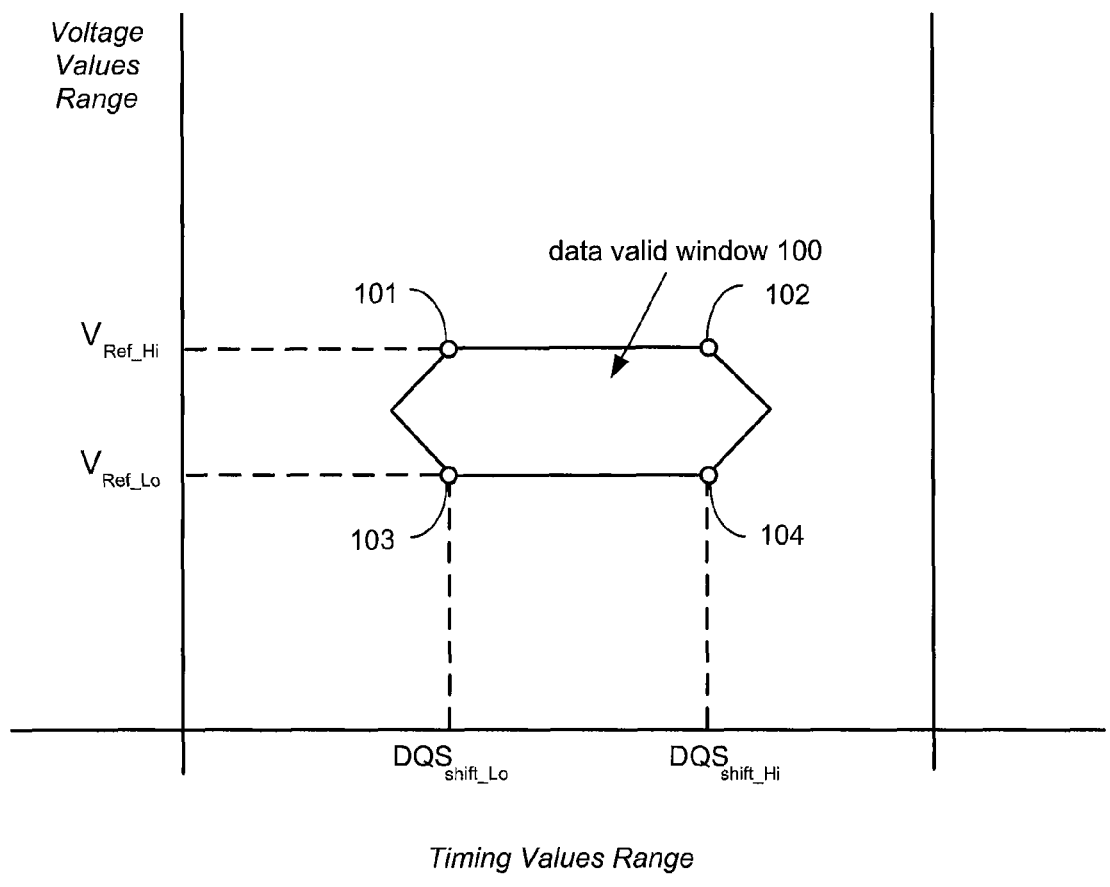
FIG. 4 is a schematic diagram that illustrates four corners associated with the data valid window of FIG. 3, in one embodiment.

FIG. 4 illustrates four corners associated with the data valid window 100, provided by way of example in FIG. 3. Four extreme points 101-104 corresponding to corners of data valid window 100 are shown. The four points 101-104 are at corners of a four-point grid representing samples taken from a individual data bit region of a given data signal, where the sampled data was determined to be valid (i.e. it matched an expected value). The four points 101-104 have respective coordinates of ($V_{Ref\_Hi}$, $DQS_{shift\_Lo}$), ($V_{Ref\_Hi}$, $DQS_{shift\_Hi}$), ($V_{Ref\_Lo}$, $DQS_{shift\_Lo}$) and ($V_{Ref\_Lo}$, $DQS_{shift\_Hi}$), where $V_{Ref\_Hi} < V_{Ref\_Max}$, $V_{Ref\_Lo} > V_{Ref\_Min}$, $DQS_{shift\_Lo} > DQS_{shift\_Min}$, and $DQS_{shift\_Hi} < DQS_{shift\_Max}$.

In one embodiment, at a minimum, only the corners of the four-point grid are tested to expedite the testing process. An assumption is made that the all interior points not shown within the four corners represent valid data (e.g. over the identified range of time and voltage values).

The grid defined by the corners represents a two-dimensional data valid window 100. To identify the corners of the data valid window 100, specification requirements can first be identified for the specific device (e.g. memory device). Then, variable test parameters values associated with the corners of the data valid window 100 (e.g. four points 101-104) can be defined, after identifying the specification requirements but before the sampling of the given data signal. Testing is then performed under conditions where the variable test parameters are set to the defined values associated with the corners of the data valid window 100. Confirmation can then be made that the grid defined by the corners is indeed a data valid window according to the identified specification requirements, by affirming that at least the identified corners represent samples in which an expected value was obtained.

In a variant embodiment, rather than testing at specific corners, all of the points within broad ranges of the variable test parameters of interest and the collection of points representing samples in which an expected value was obtained can be analyzed to determine the shape and dimensions of the largest among all possible data valid windows that may be considered, to define the actual data valid window. For example, this may be feasible in implementations where data strobe signals are not employed in testing.

As previously noted, although the examples shown in FIGS. 3 and 4 depict a two-dimensional data valid window, it will be understood by persons skilled in the art that the teachings herein may also be applied to identify data valid windows of three or more dimensions. A one-dimensional data valid window may also be identified in variant embodiments.

Figure 5:
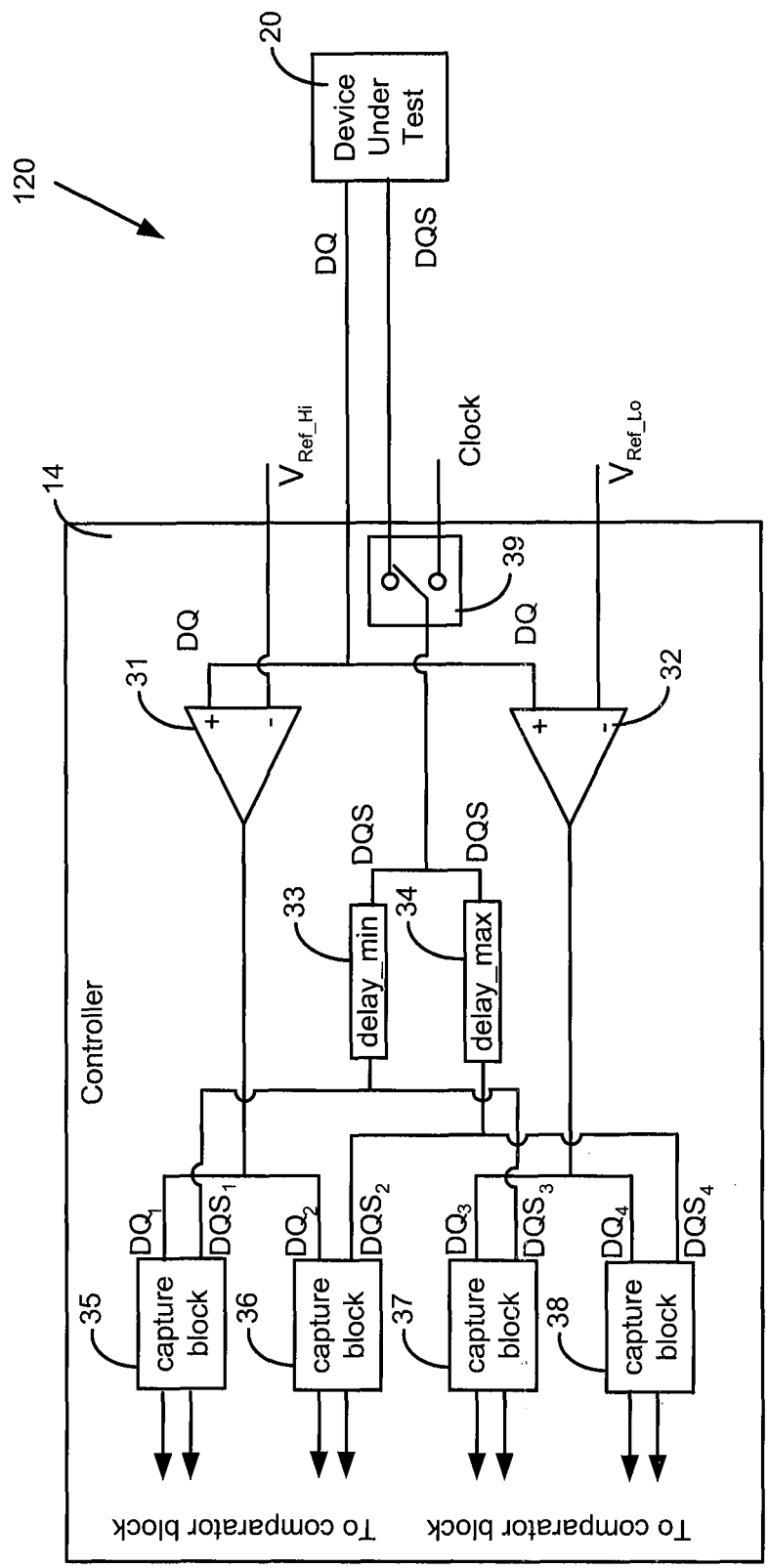
FIG. 5 is a block diagram illustrating components of a controller in the testing system of FIG. 2, in one embodiment.

FIG. 5 is a block diagram 120 illustrating components of a controller 14 in the testing system 2 of FIG. 2, in one example embodiment. In this example, controller 14 is configured to identify a two-dimensional data valid window by verifying that four pre-identified points, representing corners of the two-dimensional data valid window, are associated with samples of an individual data bit region of a given data signal in which an expected data value is obtained.

In this embodiment, controller 14 comprises two voltage comparators 31, 32, two delay elements 33, 34, and four capture blocks 35-38. It will be understood by persons skilled in the art that controller 14 may comprise additional elements that have not been explicitly shown in FIG. 5 for ease of exposition.

In operation, after a "read" command is sent by tester 10 (FIG. 2) to DUT 20, a response to the command from DUT 20 is received by controller 14 in the form of a response data signal. In this example embodiment, the response data signal comprises both a data signal DQ, and an accompanying data strobe signal DQS. However, data signal DQ may not be accompanied by a data strobe signal DQS, or a data strobe signal may accompany the data signal but an alternative sampling clock signal may be used instead, in variant embodiments.

The DQ signal is passed through two voltage comparators 31, 32, while the DQS signal is passed through two delay elements 33, 34. The two reference voltages $V_{Ref\_Hi}$, $V_{Ref\_Lo}$ for voltage comparators 31, 32 are different, and therefore, the output of voltage comparator 31 ($DQ_1$, $DQ_2$) is different from the output of voltage comparator 32 ($DQ_3$, $DQ_4$). The respective delay implemented by each of the delay elements 33, 34 (e.g. delay_min and delay_max, which values can be set to correspond with $DQS_{shift\_Lo}$ and $DQS_{shift\_Hi}$ as shown in FIG. 4) differs from each other, and therefore, the output of delay element 33 ($DQS_1$, $DQS_3$) is different from the output of delay element 34 ($DQS_2$, $DQS_4$).

Accordingly, the illustrated configuration results in four different combinations of two distinct delays and two distinct voltage comparators, and a different data/clock signal pair is used as input to each of the capture blocks 35-38 as illustrated in FIG. 5. Each of these four combinations corresponds to a captured value represented by a separate corner 101-104 in the data valid window 100 illustrated in FIG. 4.

In a variant embodiment, comparator 14 may comprise a switch 39, which allows the use of an alternate clock signal other than the data strobe signal DQS that accompanies the data signal DQ, for data sampling. The signal to be used for data sampling is determined based on the position of switch 39, which may be in at least a first position in which the data strobe signal DQS is used, and a second position in which the alternate clock signal is used. This may give testing engineers more flexibility, although it will be understood that additional testing of the alternate clock signal may be required to ensure that the testing system operates properly. Additional testing of the data strobe signal DQS may also be required to ensure that DUT 20 may be tested properly.

Figure 6:
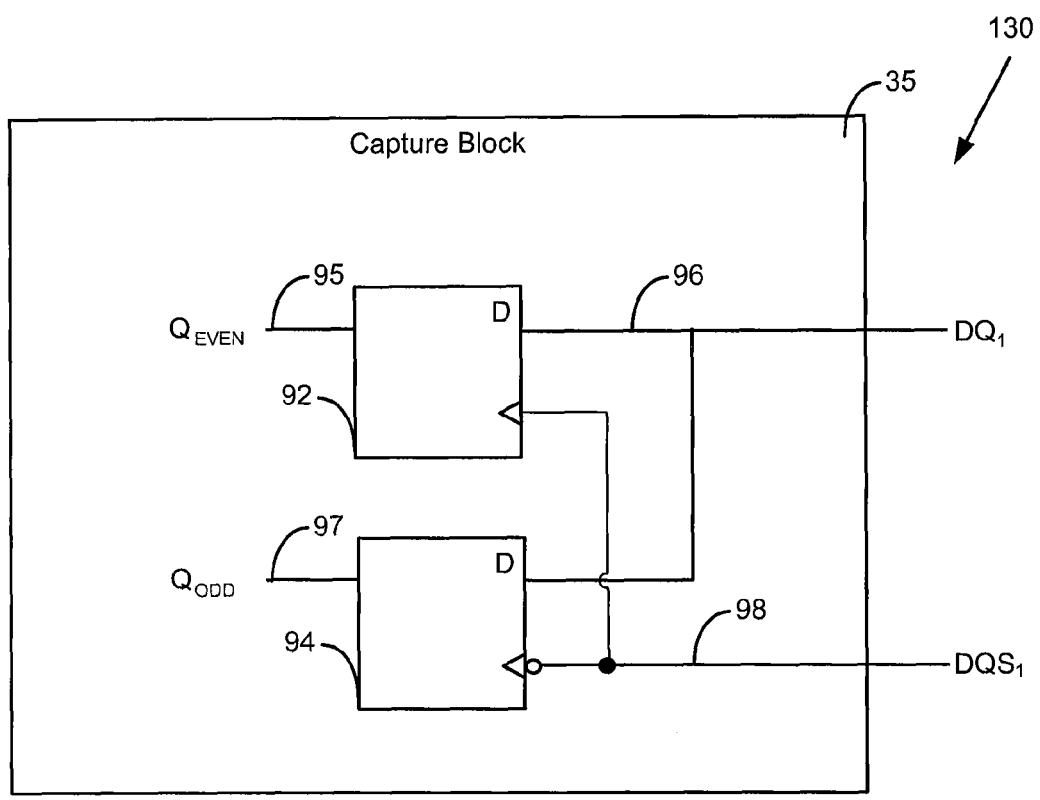
FIG. 6 is a block diagram illustrating components of a capture block in the controller of FIG. 5, in one embodiment.

FIG. 6 is a block diagram 130 illustrating components of an example capture block (e.g. capture block 35 of FIG. 5), in one embodiment. Although FIG. 6 illustrates components of capture block 35 by way of example, it will be understood that each of capture blocks 36-38 of FIG. 5 will have similar components, but will operate with different inputs as shown in FIG. 5.

Capture block 35 comprises a first register 92 and a second register 94. Capture block 35 receives a response data signal 96 received from a memory device, and an accompanying data strobe signal 98. Data signal 96 and data strobe signal 98 are input to first register 92, while data signal 96 and an inverted form of data strobe signal 98 are input to second register 94.

In this example, the device under test (e.g. memory device 22 of FIG. 2) is a memory device designed to utilize a data strobe signal. The data strobe signal may accompany both incoming and outgoing data signals. For a given memory device, this data strobe signal may be considered a clock-like, oscillating signal fed to the memory device or received from the memory device. The data strobe signal may be aligned with corresponding incoming or outgoing data signals, in a manner that facilitates the capturing of data signals at the memory device or by another data recipient (e.g. a component of a chipset on a motherboard) respectively. Some examples of memory devices that are designed to utilize a data strobe signal, and which may be tested in accordance with the teachings herein, include, without limitation, double-data rate synchronous dynamic random access memory (DDR SDRAM), double-data rate two synchronous dynamic random access memory (DDR2 SDRAM), and double-data rate three synchronous dynamic random access memory (DDR3 SDRAM).

The data strobe signal utilized by these memory devices facilitates what is known as a source-synchronous capturing of data signals, since a recipient of the data signals can use the clock-like oscillating data strobe signal provided by the memory device to determine when the data signals provided by the memory device may be validly read. Similarly, a data strobe signal received at the memory device may be provided by a device transmitting an accompanying data signal (e.g. a data transmitter such as a component in a chipset that transmits data signals to the memory device) to determine when the accompanying data signal provided to the memory device may be validly captured and written to the memory device. Data signals may be aligned differently with a corresponding data strobe signal depending on the particular operation being performed (e.g. an operation to read from, or an operation to write to the memory device).

Figure 7A:
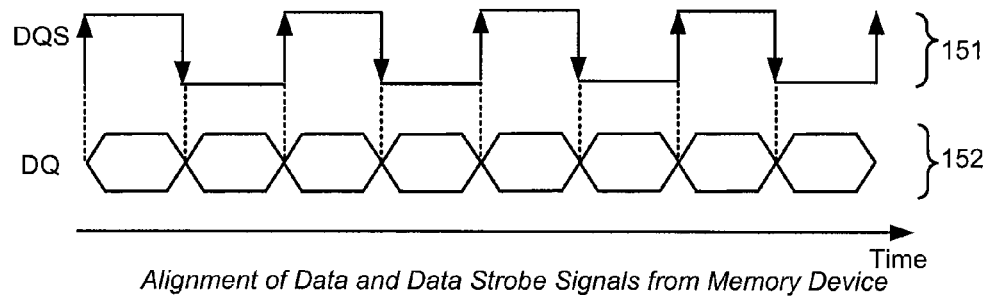
FIGS. 7A-7C are timing diagrams that illustrate how data strobe signals may be aligned with data signals, where data strobe signals and data signals are received from a memory device.
Figure 7B:
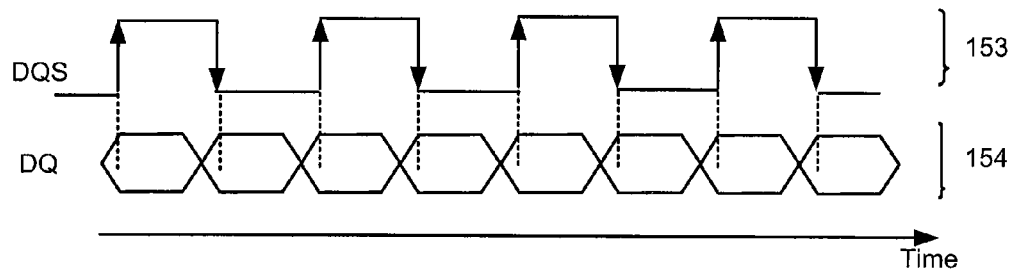
Figure 7C:
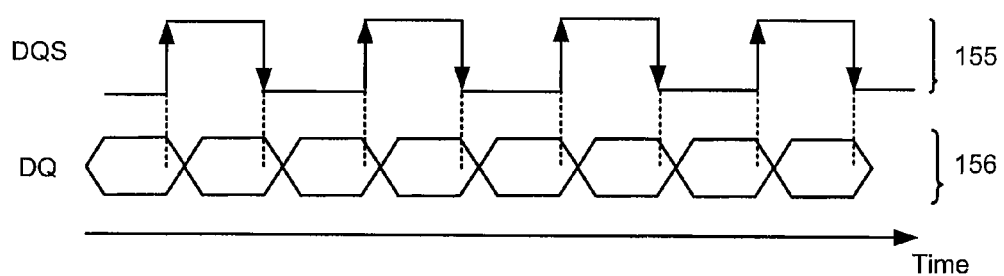

In an example system where source-synchronous capturing of data signals is employed, when data is being read from the memory device, the data strobe signal 98 (after being phase-shifted by having passed through delay elements 33, 34 of FIG. 5) will be shifted to be offset from the center of a data bit region (e.g. as shown in FIGS. 7B and 7C, where FIG. 7A illustrates a data strobe signal before phase-shifting). The corners of the data valid window in FIG. 4 are defined by appropriate shifts of the data strobe signal performed by delay elements 33 and 34 from the "start" of the data bit region and relative to the typical shift into the "center" of the data bit region.

In this example, first register 92 will capture the portion of data, from the data signal received from the memory device, that have the centers of the data signal's data bit durations aligned with the rising edges of data strobe signal 98. That portion of data ($Q_{EVEN}$) is provided at the output 95. Second register 94 will capture the portion of data, from the data signal received from the memory device, that have the centers of the data signal's data bit durations aligned with the falling edges of data strobe signal 98. That portion of data ($Q_{ODD}$) is provided at the output 97. A test engineer may design the testing system to compare outputs $Q_{EVEN}$ and $Q_{ODD}$ in parallel, although in some implementations, they may be compared consecutively using a single output signal after further processing by some logical unit [not shown] configured to combine the outputs.

To further illustrate how data strobe signals may be aligned with data signals when data strobe signals and data signals are received from a memory device 22 of DUT 20 by controller 14 of tester 10 (FIGS. 2 and 5), reference is made to the example timing diagrams of FIGS. 7A to 7C.

In FIG. 7A, a data signal DQ 152 and an accompanying data strobe signal DQS 151 are received by the tester from the DUT. FIG. 7A illustrates how the data strobe signal may be aligned with the data signal, when the signals are transmitted from one example memory device. DQS 151 is represented by a square wave, where the rising and falling edges are substantially aligned with the beginning of each of two or more consecutive data bit durations of DQ 152. Accordingly, DQS 152, which is sent from the memory device, is edge-aligned with a data bit duration. The data strobe signal facilitates the reading of multiple bits of data (e.g. 8 bits) from the memory device, and the writing of multiple bits of data to the memory device. The phase of the data strobe signal relative to the data signal may depend on the particular operation being performed (e.g. write or read).

The sampling of data signals received by the tester is synchronized with a sampling clock signal, which can operate at one of a series of phase steps in a test cycle. The sampling clock signal may be represented by a square wave, where the rising edge triggers a sampling of data signals. It will be understood that in certain test methodologies, a sampling of data signals may alternatively occur at each falling edge of clock signal, or at both the rising and falling edges of sampling clock signal, for example. As previously noted, the data strobe signal (DQS) received from the device under test may be used as the sampling clock signal. Alternatively, a different clock signal may be employed, which may be aligned with the data strobe signal, or alternatively, the delay elements of the tester have to be appropriately configured.

In accordance with one embodiment where a data strobe signal is used in the capturing of signals at the tester, a sampling clock signal may be generated by applying a phase delay to the received data strobe signal. For example, a phase delay may be applied to DQS 151, resulting in a phase-shifted data strobe signal. In FIGS. 7B and 7C, DQS 151 is shown as being shifted to the right by way of example, by pre-defined intervals of time, such as a minimum delay (delay_min) and a maximum delay (delay_max) as depicted in FIG. 5.

The delays may be set in advance by a test engineer and may be dependent on how wide the data valid window must be relative to a given data bit region, based on specification requirements. For example, if the length of a data valid window in a given dimension is required to be 50% of the size of the corresponding component of a data bit region (e.g. of the data bit duration), then delay_min may be set to 25% and delay_max may be set to 75%. If the length of the data valid window in a given dimension is required to be 66% of the size of the corresponding component of the data bit region (e.g. of the data bit duration), then delay_min may be set to 17% and delay_max may be set to 83%. These values are provides as examples only, and it will be understood that different values may be employed in variant embodiments.

Generated phase-shifted data strobe signals DQS 153 and DQS 155 are shown in FIGS. 7B and 7C respectively. Data signals DQ 154 and DQ 156, as shown in FIGS. 7B and 7C respectively, will not generally be shifted relative to DQ 152 of FIG. 7A despite the shifting of DQS 151, since all data signals 152, 154 and 156 will generally be synchronized with the DQS 151, which has a fixed phase. Furthermore, one data strobe signal is typically associated with several (e.g. 8) data bit signals, and shifting a one-bit signal (i.e. the data strobe signal) may be easier than shifting a multi-bit signal.

Accordingly, as DQS 151 is shifted by each delay element, and a sample of each data signal DQ 154, DQ 156 is taken (e.g. at the rising and falling edges of DQS signals 153, 155), it will be understood that the rising and falling edges of DQS 153 may or may not align with a part of DQ 154 from which a valid sample may be taken, depending on the length of delay_min. Similarly, the rising and falling edges of DQS 155 may or may not align with a part of DQ 156 from which a valid sample may be taken, depending on the length of delay_max. It will be understood that for any given data signal DQ, a valid sample may only be expected to be taken within a given data bit duration when the rising and falling edges of the accompanying data strobe signals DQS are aligned with a part of the given data bit duration of the data signal DQ where the data signal DQ will not be undergoing a transition from one signal level to another. The period of time in which the data signal DQ is expected to be stable can be identified, and represents the data valid window (in the temporal dimension) for the memory device from which the data signal DQ is received.

With respect to FIG. 7B, it is assumed that delay_min is sufficiently large, so that the rising and falling edges of data strobe signal 153 are substantially aligned with the front part of each of two or more consecutive data bit durations of data signal 154. Accordingly, the data strobe signal 153 being sent to capture blocks of the controller (e.g. capture blocks 35, 37 of controller 14 in FIG. 5) is shown as being aligned with a front part of data bit durations.

With respect to FIG. 7C, it is assumed that delay_max is sufficiently small, so that the rising and falling edges of data strobe signal 155 are substantially aligned with the back part of each of two or more consecutive data bit durations of data signal 156. Accordingly, the data strobe signal 155 being sent to capture blocks of the controller (e.g. capture blocks 36, 38 of controller 14 of FIG. 5) is shown as being aligned with a back part of data bit durations.

It will be understood that delay_min will typically be smaller than delay_max, and that the difference between the two delay values, the difference representing the width of the data valid window in the temporal dimension (e.g. the distance between corners 101 and 102, or corners 103 and 104 of FIG. 4), may be selected by a test engineer to at least meet certain specification requirements.

Figure 8A:
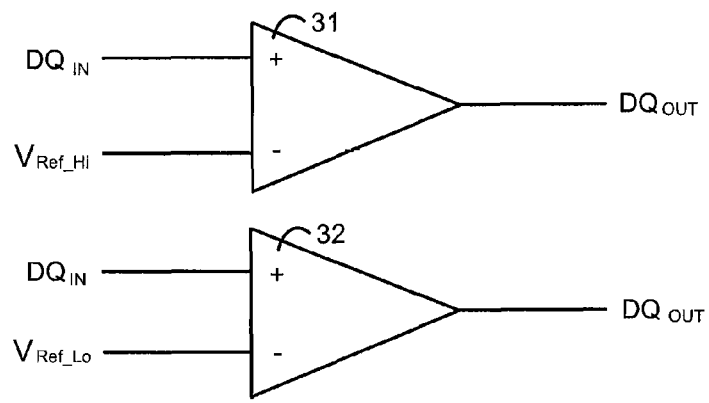
FIG. 8A is a block diagram illustrating voltage comparators of the controller of FIG. 5, in one embodiment.

FIG. 8A is a block diagram illustrating voltage comparators 31, 32 of controller 14 of FIG. 5, in one embodiment.

Each voltage comparator 31, 32 is configured to accept, as input, at least two voltage signals (one at the "+" input terminal and the other at the "−" input terminal), and to output a voltage signal ($DQ_{OUT}$) capable of driving a "high" or a "low" voltage level, corresponding to "one" and "zero" voltage levels respectively. If the voltage signal at the "+" input terminal is greater than the voltage signal at the "−" input terminal of a given voltage comparator, then the voltage signal output by the voltage comparator drives a "one" voltage level. Alternatively, if the voltage signal at the "+" input terminal is less than the voltage signal at the "−" input terminal of a given voltage comparator, then the voltage signal output by the voltage comparator drives a "zero" voltage level.

Figure 8B:
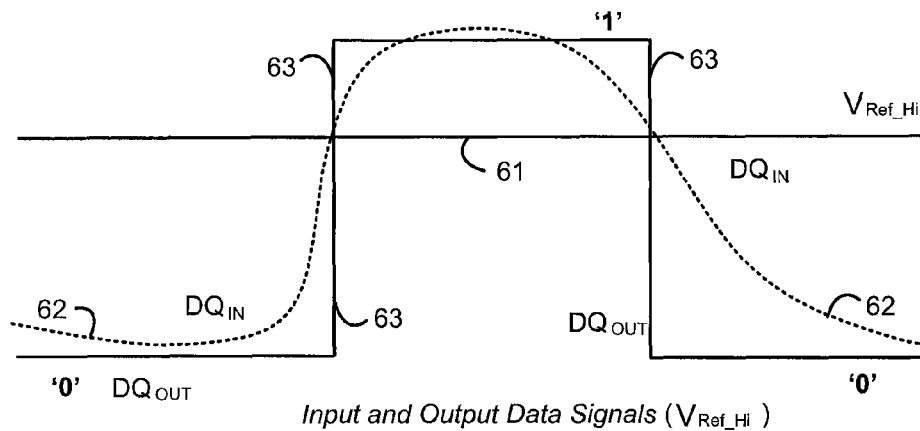
FIGS. 8B and 8C are example signal waveforms that illustrate how output data values of the voltage comparators in FIG. 8A are generated based on high and low values of a reference voltage signal.

To illustrate this idea, the signal waveform illustrated in FIG. 8B depicts a variable $DQ_{IN}$ signal 62 at the "+" input terminal of voltage comparator 31, and a fixed $V_{Ref\_Hi}$ signal 61 at the "−" input terminal of voltage comparator 31. The output from voltage comparator 31 is shown by the $DQ_{OUT}$ signal 63.

Figure 8C:
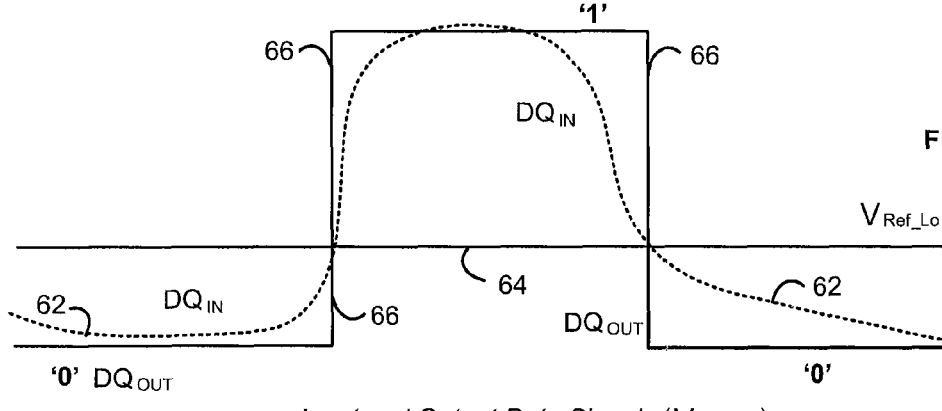

Similarly, the signal waveform illustrated in FIG. 8C depicts the same variable $DQ_{IN}$ signal 62 coming to "+" input terminal of voltage comparator 31, and a fixed $V_{Ref\_Lo}$ signal 64 (of lower value than $V_{Ref\_Hi}$ signal 61 of FIG. 8B) at the "−" input terminal of voltage comparator. In this case, the output from voltage comparator 31 is shown by $DQ_{OUT}$ signal 66.

In the examples primarily described above with reference to FIGS. 4 and 5, details of a controller configured to identify a two-dimensional data valid window are provided. The controller verifies that four pre-identified points, representing corners of the two-dimensional data valid window, are associated with samples of an individual data bit region of a given data signal in which an expected data value is obtained. In at least one embodiment, verifications for all four points are performed concurrently.

In some embodiments, the number of pre-identified points located inside the range of voltage values and inside the range of timing values (or other variable test parameter ranges as the case may be, depending on the particular embodiment) that are subject to verification may be increased from four points to any of a larger number of points. This may increase accuracy in the determination of the data valid window. In at least one embodiment, verifications for all points are performed concurrently For instance, with respect to the testing of additional points in the time dimension, the delays implemented by delay elements 33 and 34 (FIG. 5) may be modified if a memory device has "passed" certain tests with delay_min and delay_max being set at certain values. Further testing may then be performed. The delays may be set beyond minimum requirements set forth by specification requirements. The delays may also be modified to test the corners of smaller data valid windows if a memory device has initially "failed" testing, to see at what point(s) the device under test is failing, and by how much. It will be understood that in at least one embodiment described herein, the delays implemented by the delay elements of the testing system are not permanently fixed, but are programmable.

Figure 9:
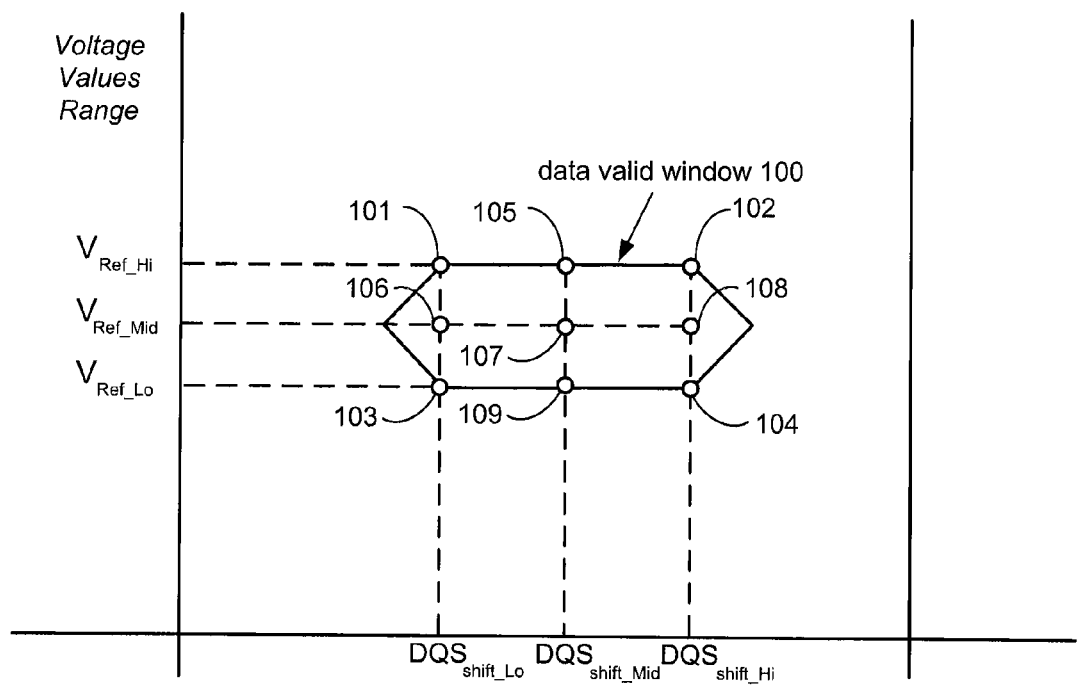
FIG. 9 is a schematic diagram that illustrates nine points associated with the data valid window of FIG. 3, in another embodiment.

As a further example, FIG. 9 is a schematic diagram that illustrates nine points associated with the data valid window 100 of FIG. 3, in another embodiment. Four extreme points 101-104 corresponding to corners of data valid window 100 are shown. The four points 101-104 are at corners of a grid representing samples taken from an individual data bit region of a given data signal, where the sampled data was determined to be valid (i.e. it matched an expected value). The four points 101-104 have respective coordinates of ($V_{Ref\_Hi}$, $DQS_{shift\_Lo}$), ($V_{Ref\_Hi}$, $DQS_{shift\_Hi}$), ($V_{Ref\_Lo}$, $DQS_{shift\_Lo}$) and ($V_{Ref\_Lo}$, $DQS_{shift\_Hi}$), where $V_{Ref\_Hi} < V_{Ref\_Max}$, $V_{Ref\_Lo} > V_{Ref\_min}$, $DQS_{shift\_Lo} > DQS_{shift\_Min}$, and $DQS_{shift\_Hi} < DQS_{shift\_Max}$. Five additional points 105-109 corresponding to points on the boundary of the grid or on the interior of the grid are also shown. These points are obtained by defining an intermediate voltage level $V_{Ref\_Mid}$, and an intermediate phase adjustment $DQS_{shift\_Mid}$, at which further samples may be taken and determinations made to verify if the sampled data is valid. The five additional points 105-109 have respective coordinates of ($V_{Ref\_Hi}$, $DQS_{shift\_Mid}$), ($V_{Ref\_Mid}$, $DQS_{shift\_Lo}$), ($V_{Ref\_Mid}$, $DQS_{shift\_Mid}$), ($V_{Ref\_Mid}$, $DQS_{shift\_Hi}$) and ($V_{Ref\_Lo}$, $DQS_{shift\_Mid}$), where $V_{Ref\_Lo} < V_{Ref\_Mid} < V_{Ref\_Hi}$, and $DQS_{shift\_Lo} < DQS_{shift\_Mid} < DQS_{shift\_Hi}$.

Figure 10:
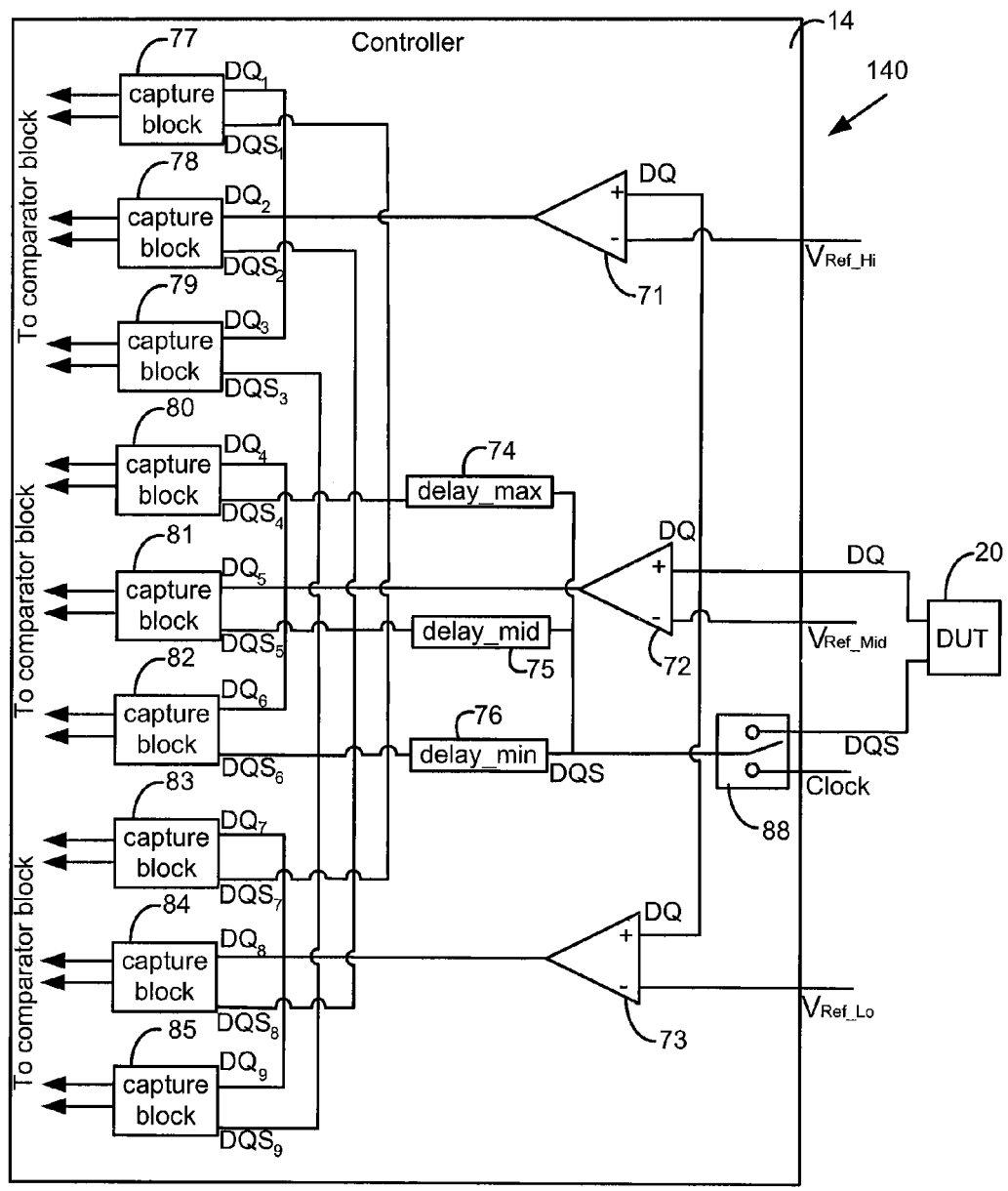
FIG. 10 is a block diagram illustrating components of a controller in a testing system of FIG. 2, in another embodiment.

FIG. 10 is a block diagram 140 illustrating components of a controller 14 in the testing system 2 of FIG. 2, in another embodiment. Controller 14 is configured to identify a two-dimensional data valid window by verifying that nine pre-identified points, representing points on the boundary or on the interior of the two-dimensional data valid window (e.g. see FIG. 9), are associated with samples of an individual data bit region of a given data signal in which an expected data value is obtained. In one embodiment, the nine points are tested, and if the nine points are determined to be associated with samples of an individual data bit region of a given data signal for which an expected data value is obtained, it is assumed that the entire range of voltage and time values represented by the data valid window represents conditions under which samples of valid data can be expected to be taken from a given data bit region of the given data signal. In at least one embodiment, verifications for all nine points are performed concurrently.

In this embodiment, controller 14 comprises three voltage comparators 71-73, three delay elements 74-76, and nine capture blocks 77-85. It will be understood by persons skilled in the art that controller 14 may comprise additional elements that have not been explicitly shown in FIG. 10 for ease of exposition.

In operation, after a "read" command is sent by tester 10 (FIG. 2) to DUT 20, a response to the command from DUT 20 is received by controller 14. In this example embodiment, the response comprises both a data signal DQ, and an accompanying data strobe signal DQS. However, as previously noted, data signal DQ may not be accompanied by a data strobe signal DQS, or a data strobe signal may accompany the data signal but an alternative sampling clock signal may be used instead, in variant embodiments.

The data signal DQ is passed through three voltage comparators 71-73, while the data strobe signal DQS is passed through three delay elements 74-76. The three reference voltages $V_{Ref\_Hi}$, $V_{Ref\_Mid}$, $V_{Ref\_Lo}$ for voltage comparators 71-73 are all different, and therefore, the output of voltage comparator 71 ($DQ_1$, $DQ_2$, $DQ_3$) is different from the output of voltage comparator 72 ($DQ_4$, $DQ_5$, $DQ_6$), which is in turn different from the output of voltage comparator 73 ($DQ_7$, $DQ_8$, $DQ_9$).

The respective delay implemented by each of the delay elements 74-76 (e.g. delay_min, delay_mid, and delay_max, which values can be set to correspond with $DQS_{shift\_Lo}$, $DQS_{shift\_Mid}$, and $DQS_{shift\_Hi}$ as shown in FIG. 9) also differ from one another, and therefore, the output of delay element 74 ($DQS_1$, $DQS_4$, $DQS_7$) is different from the output of delay element 75 ($DQS_2$, $DQS_5$, $DQS_8$), which in turn is different from the output of delay element 76 ($DQS_3$, $DQS_6$, $DQS_9$).

Accordingly, the illustrated configuration results in nine different combinations of three distinct delays and three distinct voltage comparators, and a different data/clock signal pair is used as input to each of the capture blocks 77-85 as illustrated in FIG. 10. Each of these nine combinations corresponds to a captured value represented by a separate point 101-109 in the data valid window 100 of FIG. 9.

In a variant embodiment, comparator 14 may comprise a switch 88, which allows the use of an alternate clock signal other than the data strobe signal DQS that accompanies the data signal DQ, for data sampling. The signal to be used for data sampling is determined based on the position of switch 88, which may be in at least a first position in which the data strobe signal DQS is used, and a second position in which the alternate clock signal is used. This may give testing engineers more flexibility, although it will be understood that additional testing of the alternate clock signal may be required to ensure that the testing system operates properly. Additional testing of the data strobe signal DQS may also be required to ensure that DUT 20 may be tested properly.

In variant embodiments, data signals received from a device under test by a tester may not be accompanied by a data strobe signal, and the testing system may use another clock signal, such as a clock signal generated at the tester, to facilitate data sampling. It will be understood that additional testing of the clock signal may be required to ensure the testing system operates properly.

In variant embodiments, even where data signals received from a device under test by a tester are accompanied by data strobe signals, the testing system may be designed to always use an alternate clock signal other than the data strobe signal, for data sampling. A switch need not be provided in the controller in these implementations.

Although the above examples illustrated an identification of a two-dimensional data valid window using a 2×2 or a 3×3 grid of points, it will be understood that an identification of a two-dimensional data valid window using a different number of points can be made (e.g. a 10×10, 20×20, 50×50 or a 100×100 grid of points) in variant embodiments. For greater certainty, the number of points in the first dimension need not be identical to the number of points in the second dimension (i.e. any N×M grid of points may be tested, where M and N are both greater than or equal to 1, and where M may or may not be equal to N).

Furthermore, an identification of a data valid window having dimensions greater than two may also be made in variant embodiments, by employing the teachings herein on a larger scale. In at least some of these variant embodiments, one of the dimensions will typically be time, for practical purposes.

The above examples illustrate how points associated with a data valid window 100 can be determined, where the points represent samples taken from an individual data bit region of a given data signal. It will be understood that it is possible to determine these points for the data valid window 100 by analyzing only one individual data bit region (representing a single bit value, either "1" or "0") of the given data signal, and confirming that the sampled values are valid. However, in at least one embodiment, the testing of these points is then subsequently repeated for additional data bit regions of the given data signal (e.g. multiple, successive data bit regions) associated with other bits for example, for greater accuracy.

For example, the given data signal may represent a response from a memory device to a particular test vector pattern previously transmitted to the memory device, and therefore contains a corresponding response bit pattern (e.g. 10101010). In at least one embodiment, testing is performed, for each successive bit of the response bit pattern contained in the data signal, on the associated data bit region of the data signal. This is to better ensure that the sampled values represented by points on the data valid window 100 determined based on one data bit region of the data signal, will be valid regardless of the particular data bit region of the data signal being tested. Also, employing an alternating bit pattern (e.g. 10101010) helps to delimitate the boundaries of each data bit region, since adjacent data bit regions would contain opposite logical values (i.e. "1" and "0").

For even greater accuracy, the testing of points associated with the data valid window 100 are repeated not only for multiple data bit regions of a response data signal received by the tester in response to the transmission of a test vector pattern to the memory device, but also for multiple response data signals received in response to the transmission of multiple, different test vector patterns to the memory device.

Figure 11:
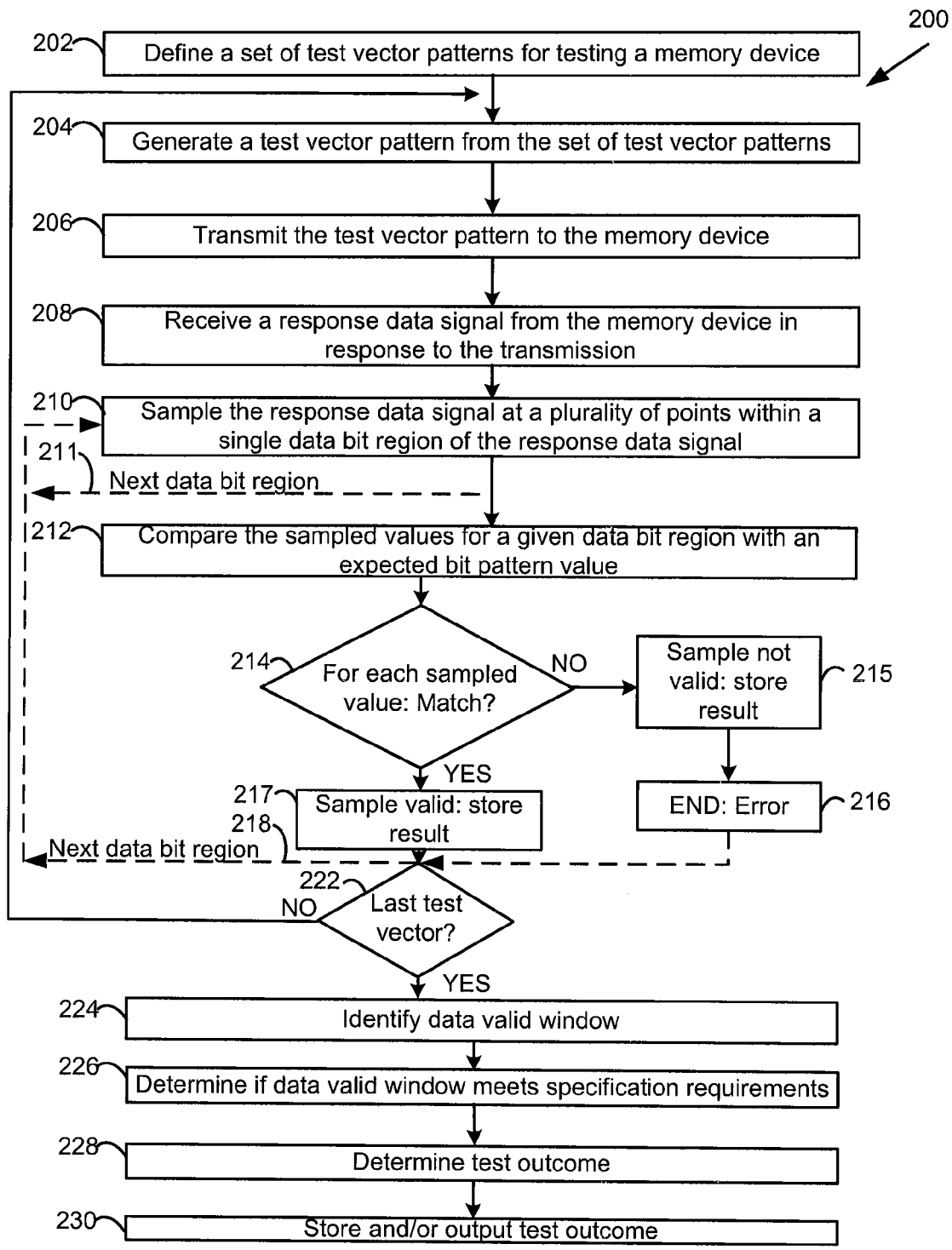
FIG. 11 is a flowchart illustrating acts in a method of testing an integrated circuit device, in accordance with at least one embodiment.

Referring now to FIG. 11, a flowchart illustrating acts in a method of testing an integrated circuit device, such as a memory device, in accordance with at least one embodiment, is shown generally as 200. Some of the features associated with method 200 may have been previously described with reference to earlier figures, and the reader is directed to the above description for further details.

In addition to data signals, the memory device may utilize a data strobe signal that facilitates a source-synchronous capturing of data, in some embodiments.

In example embodiments described herein, the acts of method 200 are performed by a tester module (e.g. tester 10). However, in variant embodiments, some of these acts may be proxied to a different module coupled to the tester module.

At 202, a finite set of test vector patterns for testing the memory device (e.g. memory device 22 of DUT 20 in FIG. 2) is defined.

At 204, a test vector pattern is generated from the set of test vector patterns defined at 202. In at least one embodiment, the test vector pattern is generated by a tester module (e.g. tester 10 of FIG. 2). For example, where the test vector pattern is generated by tester 10 of FIG. 2 as described earlier in this description, an instruction is fetched from program memory (e.g. 12 of FIG. 2) by a microprocessor (e.g. 16 of FIG. 2). In response to that instruction, the microprocessor instructs a test vector pattern generator (e.g. TVPG 18 of FIG. 2) to generate a digital representation of a test vector pattern, which is then sent to a controller (e.g. 14 of FIG. 2). The controller converts the test vector pattern into an electrical signal (a "test vector waveform") for transmission to the device under test (e.g. DUT 20 of FIG. 2), namely the memory device (e.g. 22 of FIG. 2) being tested in this example.

At 206, a data signal comprising a test vector waveform corresponding to the test vector pattern generated at 204 is transmitted to the memory device across a communication channel (e.g. 6 of FIG. 2). In one embodiment, the test vector waveform contains appropriate data signals with corresponding data strobe signals, such that capturing of data by the memory device may be performed with the assistance of the data strobe signals. Other clock signals may also be transmitted in addition to the data strobe signals.

In operation, the test vector patterns transmitted to the memory device are used to test the memory device. For example, the test vector pattern, after being converted back into digital form at the memory device, can be written to the memory device. The controller of the tester would then retrieve stored digital data across the communication channel via a "read" operation. Upon comparison (e.g. by comparator block 19 of FIG. 2) with an expected bit pattern, a microprocessor (e.g. micro-processor 16 of FIG. 2) can digitally determine if the memory device being tested is performing correctly to specification, in respect of that test vector pattern.

At 208, a response data signal comprising a bit pattern waveform transmitted by the memory device is received across the communication channel (e.g. in response to a "read" operation). The bit pattern waveform is received as an electrical signal at the tester, and corresponds to a digital signal produced by the memory device in response to the test vector pattern that was transmitted at 206.

At 210, the response data signal received at 208 is sampled at a plurality of points within an individual data bit region of the response data signal, to generate a plurality of sampled values for the second data signal for the individual data bit region. In at least one embodiment, the second data signal is sampled at the plurality of points of the individual data bit region concurrently.

In some embodiments, the response data signal may be sampled additionally at a plurality of points outside of an individual data bit region; however, employment of an alternating bit pattern (e.g. 10101010) will produce an error at these points at 212, and thus eliminate those points from inclusion into the data valid window.

Multiple samples of the individual data bit region of the response data signal may be taken at different points in time, by employing appropriately calibrated or calculated delay elements, as shown in FIGS. 5 and 10 for example. Furthermore, multiple samples of the individual data bit region of the response data signal may be taken at different voltage levels, by employing appropriately calibrated or calculated voltage comparators, as shown in FIGS. 5 and 10 for example.

The reader is directed to earlier Figures and their corresponding descriptions for additional details of act 210.

Accordingly, multiple samples of the response data signal may be taken from an individual data bit region of the response data signal in the determination of a data valid window for the memory device, using a single instance of the response data signal. In at least one embodiment, the multiple samples may be taken concurrently. Samples need not be taken from multiple instances of the same response data signal, as in certain known methods, in order to assess the range of a particular variable test parameter in which a valid sample can be expected to be taken from a given data bit region of data signals transmitted by a memory device. This may improve the speed of the testing process, potentially as a trade-off with the use of additional hardware.

At 212, for each sampled value of the plurality of sampled values determined for an individual data bit region at 210, a determination of whether the sampled value matches an expected bit pattern value corresponding to the sampled value is made.

In at least one embodiment, the determinations performed at 212 are performed concurrently.

In a variant embodiment, not all of the plurality of points need be sampled at 210 if an error is detected before all the sampled values are obtained (e.g. if a sample is taken outside of the individual data bit region's boundaries).

If the sampling at multiple points within an individual data bit region at 210 is repeated over multiple clock cycles, multiple data bit regions will be sampled, and a bit pattern determined by the sampling process is found. In those embodiments, comparisons may be performed, in "real-time" for example, as sampled values for each individual data bit region of multiple data bit regions of the response data signal are obtained at 210, as indicated generally by arrow 218. Alternatively, multiple samples obtained for different data bit regions may be accumulated (e.g. for an entire bit pattern contained in the response data signal) before they are compared to expected bit pattern values at 212, as indicated generally by arrow 211.

An expected bit pattern may be the digital representation of the bit pattern of the test vector pattern waveform generated at 204. In one example embodiment, a controller (e.g. 14 of FIG. 2) of the tester module sends the sampled incoming waveforms as bit patterns to one or more comparators (e.g. of comparator block 19 of FIG. 2), which compares the bit patterns of waveforms originating from data response signals received from the memory device under test to the previously stored reference bit patterns transmitted thereto by a reference memory device (e.g. 15 of FIG. 2).

Accordingly, decision 214 is performed, with possible outcomes 215 and 217 as shown in FIG. 11. If at least one of the comparisons performed at 212 produces a digital mismatch, then decision 214 results in a determination that at least one of the samples taken of the response data signal received from the memory device are not valid, as shown at 215. In at least one embodiment, this information (that not all samples were determined to be valid) is stored by the tester for later use (e.g.

by microprocessor 16 of FIG. 2 in a memory store). At 216, the method may end upon detecting an error, or alternatively, testing may continue (e.g. at 222) so that a more complete determination may be made of which memory cells of the memory device are failing and of which test patterns are causing the failure(s).

On the other hand, if the comparisons performed at 212 do not produce any digital mismatches, then decision 214 results in a determination that the samples of the response data signal received from the memory device is valid, as shown at 217. In at least one embodiment, this information (that the samples were determined to be valid) is stored by the tester for later use.

At 222, it is determined whether there are more test vector patterns to be transmitted to test the memory device. If so, then decision 222 may result in the flow of method 200 returning to repeat acts of method 200 beginning at 204, in order to generate another test vector pattern from the set of test vector patterns defined at 202. If there are no more test vector patterns to be transmitted to the integrated circuit module under test, then the flow of method 200 continues to 224.

At 224, a data valid window is identified for the memory device (see e.g. FIGS. 4 and 9), as defined by the points associated with samples of the data response signal verified at 210. Characteristics of the data valid window from which the ranges of different variable test parameters in which a valid sample may be taken from a given data bit region of data signals received from the memory device can be determined, and may be provided as output parameters by the tester. The characteristics of the data valid window to be determined may include, for each parameter (i.e. in each dimension), where the data valid window starts, ends, and its length, for example.

At 226, a determination is made as to whether the data valid window identified at 224 meets specification requirements associated with a type of the memory device under test. The specification requirements are used to identify conditions where the memory device should produce valid values according to specification. If the data valid window does not meet specification requirements (e.g. if any point on the data valid window should be associated with a valid sample, but does not), the memory device may be considered to have undergone failure.

At 228, a test outcome is determined. The test outcome may be recorded, output by the tester, or both, for example, at 230. The test outcome determined at 228 may indicate whether or not the data valid window identified at 224 failed to meet specification requirements as determined at 226. In one embodiment, the test outcome may explicitly identify one or more quantitative characteristics of the data valid window itself, which characteristics may include, for each parameter (i.e. in each dimension), where the data valid window starts, ends, and its length, for example.

In at least one embodiment, where the data valid window for the memory device is determined as failing to meet specification requirements, the memory device may be deemed to be defective and the test outcome may reflect this failure state accordingly. It will be understood by persons skilled in the art that the test outcome determined at 228 may also provide information on other tests that may have been performed in the test cycle. The details of other tests that may have been performed are not explicitly described herein, for ease of exposition.

Although the embodiments described herein primarily illustrate acts in the testing of a single memory device, multiple memory devices may also be tested in variant embodiments. Furthermore, one or more other integrated circuit devices may also be tested in variant embodiments.

The embodiments described herein have been shown and described by way of a number of examples. It will be apparent to those skilled in the art that changes and modifications to the described embodiments may be made without departing from the substance and scope of the described embodiments, as defined in the appended claims.

The invention claimed is:

1. A method of testing a memory device, the method comprising:
generating a plurality of test vector patterns;
for each test vector pattern of the plurality of test vector patterns:
transmitting a first data signal comprising the test vector pattern to the memory device;
receiving a second data signal from the memory device in response to the transmitting;
for each individual data bit region of one or more data bit regions of the second data signal, sampling the individual data bit region at each point of an N×M grid, where M and N are both greater than one, to produce a plurality of sampled values for the second data signal;
wherein the second data signal is sampled at each point of the N×M grid, of the individual data bit region, concurrently; and
responsive to said sampling, for each sampled value of the plurality of sampled values, determining whether the sampled value matches an expected bit pattern value corresponding to the sampled value;
for each of the plurality of test vector patterns, and for each point of the N×M grid, determining if the sampled value produced for the point matches the expected bit pattern value corresponding to the sampled value;
determining one or more characteristics of a data valid window, wherein the data valid window is identified from one or more points, of the N×M grid, that produced one or more sampled values matching the expected bit pattern values corresponding to the sampled values for each of the plurality of test vector patterns, wherein each of the one or more points is on a boundary or within the data valid window, and wherein the data valid window defines conditions under which a valid sample can be expected to be taken from a given data bit region of data signals transmitted by the memory device; and
outputting a test outcome based on the one or more characteristics of the data valid window.

2. The method of claim 1, wherein the determining if the sampled value produced for each point on the N×M grid matches the expected bit pattern value is performed concurrently for all of the points of the N×M grid.

3. The method of claim 1, further comprising:
comparing the one or more characteristics of the data valid window with specification requirements for the memory device;
wherein the test outcome indicates whether the one or more characteristics of the data valid window meet the specification requirements.

4. The method of claim 1, wherein sampling the individual data bit region of the second data signal at each point of the N×M grid comprises sampling the individual data bit region of the second data signal at M points in time, and wherein the data valid window defines a period of time in which the valid sample can be expected to be taken from a given data bit region of data signals transmitted by the memory device.

5. The method of claim 4, further comprising:
  identifying specification requirements for the memory device; and
  defining the plurality of points in time after identifying the specification requirements, but prior to the sampling.

6. The method of claim 1, wherein sampling the individual data bit region of the second data signal at each point of the N×M grid comprises sampling the individual data bit region of the second data signal at N voltage levels, and wherein the data valid window defines a voltage range in which the valid sample can be expected to be taken from a given data bit region of data signals transmitted by the memory device.

7. The method of claim 6, further comprising:
  identifying specification requirements for the memory device; and
  defining the plurality of voltage levels after identifying the specification requirements, but prior to the sampling.

8. The method of claim 1, wherein sampling the individual data bit region of the second data signal at each point of the N×M grid comprises sampling the individual data bit region of the second data signal at M points in time at each one of N voltage levels, and wherein the data valid window defines a period of time, for each voltage level within a voltage range of a given data bit region of data signals transmitted by the memory device, in which the valid sample can be expected to be taken from the given data bit region.

9. The method of claim 8, further comprising:
  identifying specification requirements for the memory device; and
  defining the plurality of points in time and the plurality of voltage levels after identifying the specification requirements, but prior to the sampling.

10. The method of claim 1, wherein sampling the individual data bit region of the second data signal at each point of the N×M grid comprises: for each variable test parameter of a plurality of variable test parameters, sampling the individual data bit region of the second data signal at different values for the variable test parameter, wherein the data valid window defines a range of values for the variable test parameter in which the valid sample can be expected to be taken from a given data bit region of data signals transmitted by the memory device.

11. The method of claim 10, further comprising:
  identifying specification requirements for the memory device; and
  for each variable test parameter of the plurality of variable test parameters, defining the different values for the variable test parameter after identifying the specification requirements, but prior to the sampling.

12. The method of claim 10, wherein the plurality of variable test parameters comprises at least three different variable test parameters.

13. The method of claim 1, wherein the test vector pattern is written to the memory device, and wherein the second data signal comprises a bit pattern read from the memory device in response to the transmitting.

14. The method of claim 1, wherein the memory device utilizes a data strobe signal that accompanies data signals transmitted by the memory device.

15. The method of claim 14, wherein the data strobe signal is employed when sampling the second data signal.

16. The method of claim 1, further comprising generating a sampling clock signal, and wherein the sampling clock signal is employed when sampling the second data signal.

17. The method of claim 1, wherein the memory device is comprised within a memory module.

18. The method of claim 1, wherein: both M and N are equal to two; both M and N are equal to three; or, M is not equal to N.

19. The method of claim 1, wherein the data valid window has greater than two dimensions.

20. A testing system for testing a memory device, the system comprising:
  a processor;
  a program memory; and
  a controller;
  wherein the system is configured to:
  generate a plurality of test vector patterns;
  for each test vector pattern of the plurality of test vector patterns:
    transmit a first data signal comprising the test vector pattern to the memory device;
    receive a second data signal from the memory device in response to a transmission of the first data signal;
    for each individual data bit region of one or more data bit regions of the second data signal, sample the individual data bit region at each point of an N×M grid, where M and N are both greater than one, to produce a plurality of sampled values;
    wherein the system is configured to sample the second data signal at each point of the N×M grid, of the individual data bit region, concurrently; and
    responsive to sampling the individual data bit region at a plurality of points, for each sampled value of the plurality of sampled values, determine whether the sampled value matches an expected bit pattern value corresponding to the sampled value;
  for each of the plurality of test vector patterns, and for each point of the N×M grid, determine if the sampled value produced for the point matches the expected bit pattern value corresponding to the sampled value;
  determine one or more characteristics of a data valid window, wherein the data valid window is identified from one or more points, of the N×M grid, that produced one or more sampled values matching the expected bit pattern values corresponding to the sampled values for each of the plurality of test vector patterns, wherein each of the one or more points is on a boundary or within the data valid window, and wherein the data valid window defines conditions under which a valid sample can be expected to be taken from a given data bit region of data signals transmitted by the memory device; and
  output a test outcome based on one or more characteristics of the identified data valid window.

21. The system of claim 20, wherein the system is configured to determine if the sampled value produced for each point on the N×M grid matches the expected bit pattern value concurrently for all of the points of the N×M grid.

22. The system of claim 20, wherein the system is further configured to:
  compare the one or more characteristics of the data valid window identified in the output parameters with specification requirements for the memory device;
  wherein the test outcome indicates whether the one or more characteristics of the data valid window meet the specification requirements.

23. The system of claim 20, wherein the controller comprises a plurality of delay elements configured to receive the second data signal such that the individual data bit region of the second data signal is sampled at M points in time, and wherein the data valid window defines a period of time in which the valid sample can be expected to be taken from a given data bit region of data signals transmitted by the memory device.

24. The system of claim 23, wherein delays implemented by the plurality of delay elements are programmable.

25. The system of claim 20, wherein the controller comprises a plurality of voltage comparators configured to receive the second data signal such that the individual data bit region of the second data signal is sampled at N voltage levels, and wherein the data valid window defines a voltage range in which the valid sample can be expected to be taken from a given data bit region of data signals transmitted by the memory device.

26. The system of claim 20, wherein the controller comprises both a plurality of delay elements and a plurality of voltage comparators configured to receive the second data signal such that the individual data bit region of the second data signal is sampled at M points in time at each one of N voltage levels, and wherein the data valid window defines a period of time, for each voltage level within a voltage range of a given data bit region of data signals transmitted by the memory device, in which the valid sample can be expected to be taken from the given data bit region.

27. The system of claim 26, wherein delays implemented by the plurality of delay elements are programmable.

28. The system of claim 20, wherein for each variable test parameter of a plurality of variable test parameters: the controller comprises a plurality of circuit elements configured to receive the second data signal such that the individual data bit region of the second data signal is sampled at different values for the variable test parameter, and wherein the data valid window defines a range of values for the variable test parameter in which the valid sample can be expected to be taken from a given data bit region of data signals transmitted by the memory device.

29. The system of claim 28, wherein the plurality of variable test parameters comprises at least three different variable test parameters.

30. The system of claim 20, wherein the memory device utilizes a data strobe signal that accompanies data signals transmitted by the memory device, and wherein the controller is configured to employ the data strobe signal to sample the second data signal.

31. The system of claim 30, wherein the controller comprises a switch, wherein when the switch is in a first position, the controller employs the data strobe signal to sample the second data signal, and wherein when the switch is in a second position, the controller employs a sampling clock signal provided by the system to sample the second data signal.

32. The system of claim 20, wherein the memory device is comprised within a memory module, and wherein the system comprises one or more of: at least one reference memory device or at least one reference memory module from which the expected bit pattern is obtained.

33. The system of claim 20, further comprising: a test vector pattern generator for generating the plurality of test vector patterns, and at least one comparator for determining whether the sampled value matches an expected bit pattern value corresponding to the sampled value.

34. The system of claim 20, wherein both M and N are equal to two; both M and N are equal to three; or, M is not equal to N.

35. The system of claim 20, wherein the data valid window has greater than two dimensions.

36. A method of testing a memory device, the method comprising:
generating a plurality of test vector patterns;
for each test vector pattern of the plurality of test vector patterns:
transmitting a first data signal comprising the test vector pattern to the memory device;
receiving a second data signal from the memory device in response to the transmitting;
for each individual data bit region of one or more data bit regions of the second data signal, sampling the individual data bit region at each point of an N×M grid, where M and N are both greater than one, to produce a plurality of sampled values for the second data signal; and
responsive to said sampling, for each sampled value of the plurality of sampled values, determining whether the sampled value matches an expected bit pattern value corresponding to the sampled value;
for each of the plurality of test vector patterns, and for each point of the N×M grid, determining if the sampled value produced for the point matches the expected bit pattern value corresponding to the sampled value;
wherein the determining if the sampled value produced for each point on the N×M grid matches the expected bit pattern value is performed concurrently for all of the points of the N×M grid;
determining one or more characteristics of a data valid window, wherein the data valid window is identified from one or more points, of the N×M grid, that produced one or more sampled values matching the expected bit pattern values corresponding to the sampled values for each of the plurality of test vector patterns, wherein each of the one or more points is on a boundary or within the data valid window, and wherein the data valid window defines conditions under which a valid sample can be expected to be taken from a given data bit region of data signals transmitted by the memory device; and
outputting a test outcome based on the one or more characteristics of the data valid window.

37. A testing system for testing a memory device, the system comprising:
a processor;
a program memory; and
a controller;
wherein the system is configured to:
generate a plurality of test vector patterns;
for each test vector pattern of the plurality of test vector patterns:
transmit a first data signal comprising the test vector pattern to the memory device;
receive a second data signal from the memory device in response to a transmission of the first data signal;
for each individual data bit region of one or more data bit regions of the second data signal, sample the individual data bit region at each point of an N×M grid, where M and N are both greater than one, to produce a plurality of sampled values; and
responsive to sampling the individual data bit region at a plurality of points, for each sampled value of the plurality of sampled values, determine whether the sampled value matches an expected bit pattern value corresponding to the sampled value;
for each of the plurality of test vector patterns, and for each point of the N×M grid, determine if the sampled value produced for the point matches the expected bit pattern value corresponding to the sampled value;

wherein the system is configured to determine if the sampled value produced for each point on the N×M grid matches the expected bit pattern value concurrently for all of the points of the N×M grid;

determine one or more characteristics of a data valid window, wherein the data valid window is identified from one or more points, of the N×M grid, that produced one or more sampled values matching the expected bit pattern values corresponding to the sampled values for each of the plurality of test vector patterns, wherein each of the one or more points is on a boundary or within the data valid window, and wherein the data valid window defines conditions under which a valid sample can be expected to be taken from a given data bit region of data signals transmitted by the memory device; and output a test outcome based on one or more characteristics of the identified data valid window.

* * * * *